United States Patent
Abe et al.

(10) Patent No.: US 7,590,004 B2
(45) Date of Patent: Sep. 15, 2009

(54) NONVOLATILE SEMICONDUCTOR MEMORY HAVING A PLURALITY OF INTERCONNECT LAYERS

(75) Inventors: Takumi Abe, Yokohama (JP); Koichi Fukuda, Yokohama (JP); Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 413 days.

(21) Appl. No.: 11/345,505

(22) Filed: Feb. 2, 2006

(65) Prior Publication Data

US 2006/0198196 A1 Sep. 7, 2006

(30) Foreign Application Priority Data

| Feb. 4, 2005 | (JP) | ............................. 2005-029280 |
| Jan. 19, 2006 | (JP) | ............................. 2006-011646 |

(51) Int. Cl.
*G11C 16/22* (2006.01)
(52) U.S. Cl. ............................. 365/185.18; 365/185.01; 365/185.16; 365/185.17; 257/314; 257/E21.69
(58) Field of Classification Search ................. 257/314, 257/E21.69, E27.103; 365/185.18
See application file for complete search history.

(56) References Cited

U.S. PATENT DOCUMENTS

| 5,898,606 | A  * | 4/1999  | Kobayashi et al. ............. 365/63 |
| 7,446,038 | B2 * | 11/2008 | Jeng ............................. 438/666 |
| 2001/0017418 | A1 * | 8/2001  | Noguchi et al. ............. 257/758 |
| 2004/0001358 | A1 * | 1/2004  | Nahas et al. ............ 365/185.18 |
| 2004/0251488 | A1 * | 12/2004 | Fujiwara et al. ............. 257/315 |
| 2005/0051831 | A1 * | 3/2005  | Kajimoto et al. ............. 257/314 |
| 2005/0128843 | A1 * | 6/2005  | Kajimoto et al. ............. 365/205 |
| 2006/0198196 | A1   | 9/2006  | Abe et al. |

OTHER PUBLICATIONS

Ken Takeuchi, et al., "A Double-Level-Vth Select Gate Array Architecture for Multi-Level NAND Flash Memories", 1995 Symposium on VLSI Circuits Digest of Technical Papers, Jun. 1995, pp. 69-70.
Takahiko Hara, et al., "A 146mm$^2$ 8Gb NAND Flash Memory with 70nm CMOS Technology", ISSCC Digest of Technical Papers, 2005 IEEE International Solid-State Circuits Conference, Session 2, Non-Volatile Memory, 2.1, Feb. 7, 2005, pp. 44-45.
Takumi Abe, et al. "Design of 8Gb NAND Flash Memory with 70nm CMOS Technology", IEICE Technical Report, ICD2005-10, Apr 2005, pp. 47-52 (with English Abstract).
U.S. Appl. No. 12/043,510, filed Mar. 6, 2008, Hosono, et al.

* cited by examiner

*Primary Examiner*—Lynne Gurley
*Assistant Examiner*—Vernon P Webb
(74) *Attorney, Agent, or Firm*—Oblon, Spivak, McClelland, Maier & Neustadt, P.C.

(57) ABSTRACT

A nonvolatile semiconductor memory includes a memory cell array including horizontally aligned memory cell columns, each including vertically arranged memory cell transistors and select transistors selecting the memory cell transistors; first cell well lines connecting well regions in which the memory cell columns are formed; second cell well lines arranged in an interconnect layer above the first cell well lines and connecting the first cell well lines to one another electrically; and a cell source line connecting source terminals of the select transistors in each memory cell column.

20 Claims, 21 Drawing Sheets

NONVOLATILE SEMICONDUCTOR MEMORY HAVING A PLURALITY OF INTERCONNECT LAYERS

CROSS REFERENCE TO RELATED APPLICATIONS AND INCORPORATION BY REFERENCE

This application is based upon and claims the benefit of priority from prior Japanese Patent Application P2005-029280 filed on Feb. 4, 2005 and prior Japanese Patent Application P2006-011646 filed on Jan. 19, 2006; the entire contents of which are incorporated by reference herein.

BACKGROUND OF THE INVENTION

1. Field of the Invention

The present invention relates to a semiconductor memory, particularly to a nonvolatile semiconductor memory having a plurality of interconnect layers.

2. Description of the Related Art

A plurality of memory cell transistors are arranged in a matrix on a memory cell array region of a nonvolatile semiconductor memory. In a nonvolatile semiconductor memory, a determination of whether each of memory cell transistors stays either in a logic '1' state or a logic '0' state is based on a threshold voltage varying in relation to the amount of charge accumulated in each floating gate. The memory cell transistors are formed in a p-well region formed in a substrate. To inject charges into the floating gates of the respective memory cell transistors, 0V is applied to the p-well region, and a high voltage is applied to control gates of the respective memory cell transistors. To remove charges from the floating gates, 0V is applied to the control gates and a high voltage is applied to the p-well region. The status of the memory cell transistors are determined in the following manner, for example. When a memory cell transistor, to be read, is in a conductive state, the nonvolatile semiconductor memory is set so that a current flows from a bit line to a corresponding cell source line. Current flowing from the bit line to the cell source line changes bit line potential. The status of the memory cell transistor to be read may be determined by detecting the bit line potential. In other words, reading data from a target memory cell transistor is possible.

For a NAND-type nonvolatile semiconductor memory, reading data from many memory cell transistors simultaneously is possible. When there are many memory cell transistors in a conductive state, a large amount of current flows from bit lines to cell source lines. Therefore, when the interconnect resistance of the cell source lines is high, the cell source line potential changes from 0V to a positive voltage. When the cell source line potential changes to a positive voltage, current flowing from bit lines to cell source lines decreases. As a result, a change in the bit line potential is small, and a change in the bit line potential may not be detected. In addition, when the interconnect resistance between a cell source driver, which controls cell source line potential, and a corresponding control gate is high, the RC time constant of the cell source lines increases. Accordingly, the cell source line charge/discharge time and recovery time for coupling noise occurs in a cell source line under the influence of other interconnects increases, reducing the performance of the NAND-type nonvolatile semiconductor memory. Therefore, the interconnect resistance of the cell source lines is required to be decreased.

When the p-well region potential, which should be fixed to 0V during a read operation, changes to a positive voltage, the threshold voltages of the memory cell transistors are lower than in the case when the p-well region potential is 0V. As a result, the memory cell transistors that are not in a conductive state may be determined to be in a conductive state. In addition, when the interconnect resistance between each cell well driver, which controls the p-well region potential, and the p-well region is high, the RC time constant of the cell well lines increases. When the RC time constant of the cell well lines is increased, the charge/discharge time of the p-well region and the recovery time for signals transferred through the cell well lines in which coupling noise occurs increases. As a result, the performance of the NAND-type nonvolatile semiconductor memory is reduced. Therefore, the interconnect resistance of the cell well lines is required to be decreased.

In the NAND-type nonvolatile semiconductor memory, a memory cell array is typically formed in a p-well region to improve integration. A cell well driver, to set the p-well region potential, and the p-well region are electrically connected. Bit lines are very densely arranged in an interconnect layer above a region where the memory cell transistors are arranged. Accordingly, it is impossible to arrange cell source lines and/or cell well lines in the interconnect layer above the region where the memory cell transistors are arranged. Therefore, a region where memory cell transistors are not arranged (hereafter, referred to as 'shunt region') is prepared in the memory cell array. Since bit lines are not arranged above the shunt region, the cell source lines and/or the cell well lines are arranged in an interconnect layer above the shunt region. The p-well region and the cell well driver are connected in the shunt region.

Along with an increase in capacity of the NAND-type nonvolatile semiconductor memory, there is an increased need to further improve the integration. In addition, the area of the memory cell array further increases. As a result, there is an undesirable change in the potential of the cell source lines arranged away from the cell source driver, and a change in the potential of the p-well region arranged away from the cell well driver. However, the area of the shunt regions and the number thereof needs to be reduced to improve the integration. As a result, a decrease in the interconnect resistance of the cell source lines and the interconnect resistance of the cell well lines cannot be sufficiently achieved.

SUMMARY OF THE INVENTION

An aspect of the present invention inheres in a nonvolatile semiconductor memory. The memory includes a memory cell array including horizontally aligned memory cell columns, each of the memory cell columns including vertically arranged memory cell transistors and select transistors selecting the memory cell transistors; a plurality of first cell well lines connected to well regions in which the memory cell columns are formed; a plurality of second cell well lines being arranged in an interconnect layer above the first cell well lines and connected to the first cell well lines so that the first cell well lines electrically connect to one another; and a cell source line connected to source terminals of the select transistors in each memory cell column.

Another aspect of the present invention inheres in a nonvolatile semiconductor memory. The memory includes a memory cell array including horizontally arranged memory cell columns, each of the memory cell columns including vertically aligned memory cell transistors and select transistors selecting the memory cell transistors; a plurality of first cell well lines connected to well regions in which the memory cell columns are formed; a plurality of first cell source lines connected to source terminals of the select transistors in each memory cell column; a second cell well line being arranged in an interconnect layer above the first cell well lines and connected to the first cell well lines; and a second cell source line being arranged in an interconnect layer in which the second cell well line is arranged so as to form an interdigital structure with the second cell well line, and connected to the first cell source lines.

DETAILED DESCRIPTION OF THE INVENTION

Figure 1:
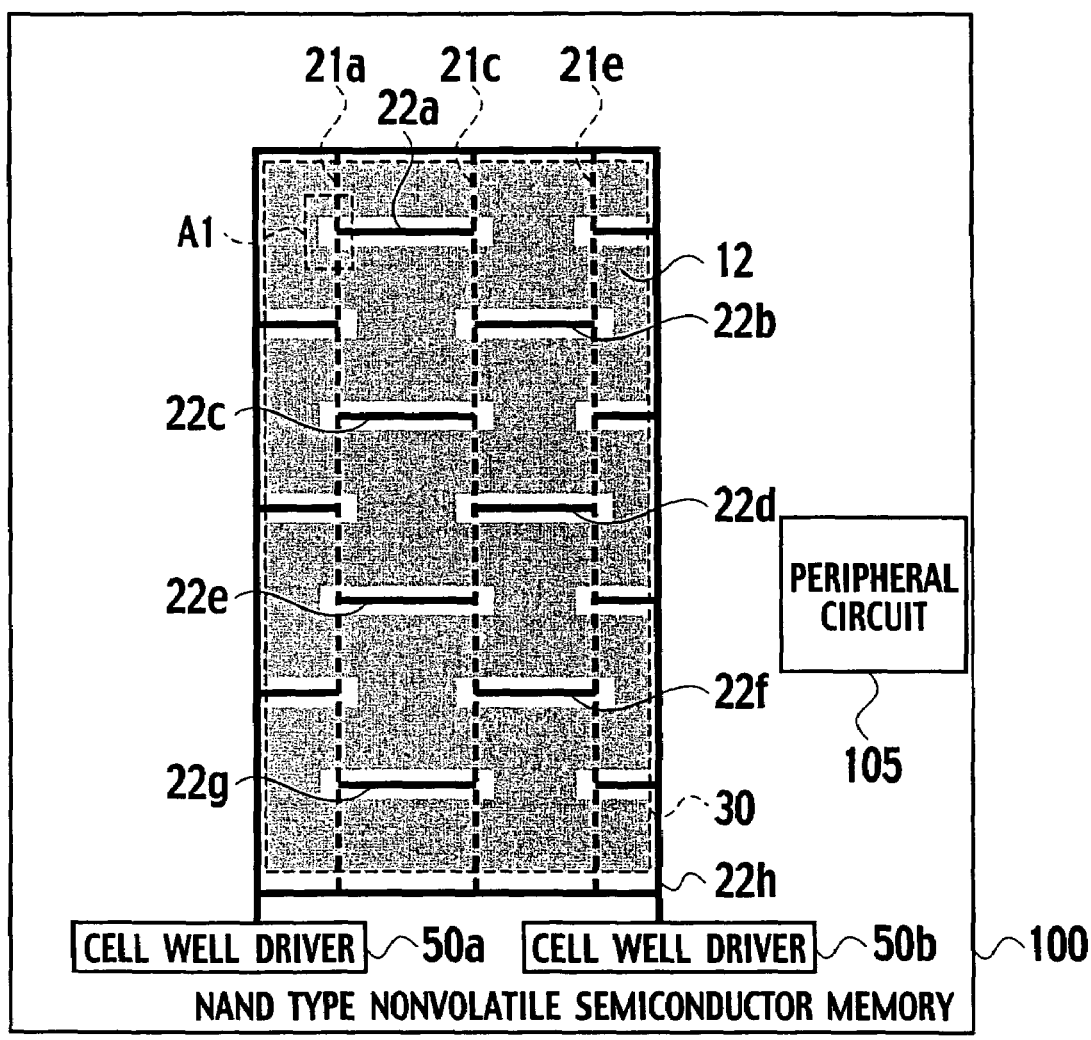
FIG. 1 shows a schematic structure of a NAND-type nonvolatile semiconductor memory according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure.

In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

FIRST EMBODIMENT

As shown in FIG. 1, a NAND-type nonvolatile semiconductor memory 100, according to the first embodiment of the present invention, includes a memory cell array 30, a plurality of first cell well lines 21a, 21c, and 21e, a plurality of second cell well lines 22a through 22h and a second cell source line 12. The memory cell columns, each including a plurality of vertically aligned memory cell transistors and select transistors that select the memory cell transistors, are horizontally aligned in the memory cell array 30. The first cell well lines 21a, 21c, and 21e are connected to well regions in which the memory cell columns are formed. The second cell well lines 22a through 22h are arranged in an interconnect layer above the first cell well lines 21a, 21c, and 21e. The second cell well lines 22a through 22h are connected to the first cell well lines 21a, 21c, and 21e so that the first cell well lines 21a, 21c, and 21e electrically connect to one another. The second cell source line 12 is connected to source terminals of the respective select transistors in the memory cell columns.

Hereafter, an interconnect layer in which the first cell well lines 21a, 21c, and 21e are arranged is referred to as 'first interconnect layer', and an interconnect layer in which the second cell well lines 22a through 22h are arranged is referred to as 'second interconnect layer'. The second cell source line 12 is arranged in the second interconnect layer in which the second cell well lines 22a through 22h are arranged. The second cell source line 12 is connected to the source terminals of the respective select transistors in the memory cell columns through a plurality of first cell source lines, which are not shown in FIG. 1. The first cell source lines are arranged in the interconnect layer in which the first cell well lines 21a, 21c, and 21e are arranged. Details on the first cell source lines are described later.

As shown in FIG. 1, the second cell source line 12 surrounds the second cell well lines 22a through 22h. In other words, the second cell source line 12 is arranged in the second interconnect layer, which is not separated by the second cell well lines 22a through 22h. The second cell well line 22h is connected to cell well drivers 50a and 50b. The second cell well line 22h is arranged in a ring shape on the outer region of the memory cell array 30. FIG. 1 illustrates a case where there are eight second cell well lines 22a through 22h; however, the number of second cell well lines is not limited to eight. As shown by a dashed line in FIG. 1, the memory cell array 30 is a rectangular. A peripheral circuit 105 controls the operations of the memory cell transistors arranged in the memory cell array 30.

Figure 2:
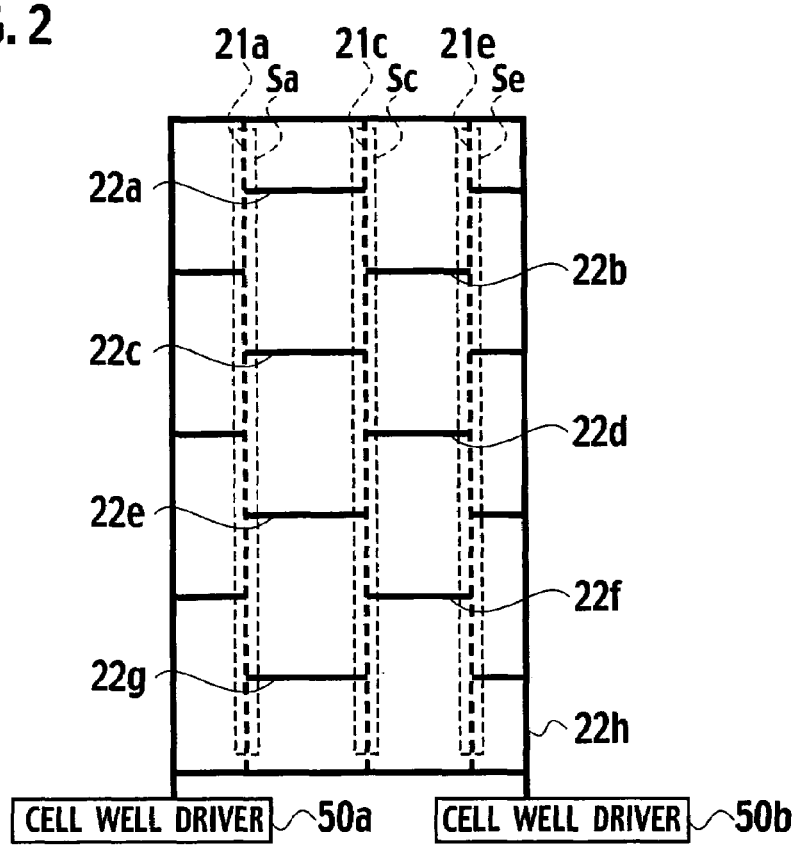
FIG. 2 shows a schematic structure of cell well lines of a NAND-type nonvolatile semiconductor memory according to the first embodiment of the present invention.

FIG. 2 shows an exemplary arrangement of the first cell well lines 21a, 21c, and 21e and the second cell well lines 22a through 22h of the NAND-type nonvolatile semiconductor memory 100 shown in FIG. 1. In FIG. 2, the first cell well lines 21a, 21c, and 21e, arranged in the first interconnect layer, are shown by dotted lines, and the second cell well lines 22a through 22h, arranged in the second interconnect layer, are shown by solid lines. In FIG. 2, vias which connect the first cell well lines 21a, 21c, and 21e and the second cell well lines 22a through 22h are omitted. The first cell well lines 21a, 21c, and 21e are arranged on shunt regions Sa, Sc, and Se, respectively. As shown in FIG. 2, the first cell well lines 21a, 21c, and 21e are connected to one another through the second cell-well lines 22a through 22h. Thus, interconnect resistance from the cell well drivers 50a and 50b to the first cell well lines 21a through 21c is reduced. As a result, interconnect resistance from the cell well drivers 50a and 50b to a p-well region 80 is reduced.

Figure 3:
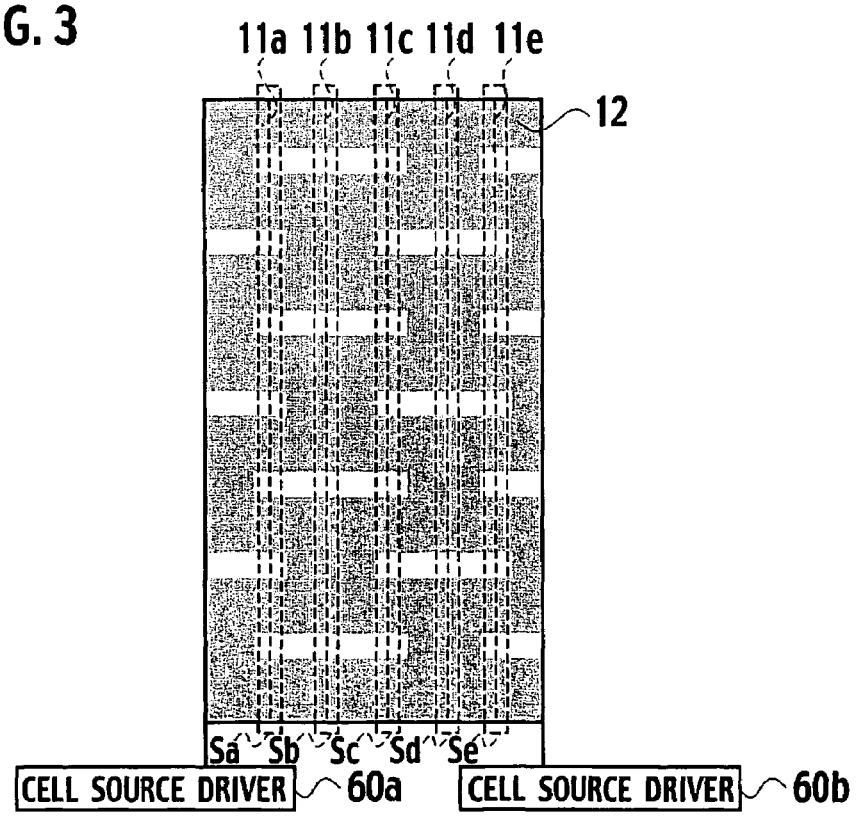
FIG. 3 shows a schematic structure of cell source lines of a NAND-type nonvolatile semiconductor memory according to the first embodiment of the present invention.

FIG. 3 shows an exemplary arrangement of the second source line 12 in the NAND-type nonvolatile semiconductor memory 100 shown in FIG. 1 and first cell source lines 11a through 11e. In FIG. 3, the first cell source lines 11a through 11e are shown by dotted lines, and the second cell source line 12 is shaded and shown by a solid line. In FIG. 3, vias which connect the first cell source lines 11a through 11e and the second cell source line 12 are omitted. The second cell source line 12 is connected to cell source drivers 60a and 60b, which control cell source line potential. The first cell source lines 11a through 11e are arranged on respective shunt regions Sa through Se. The continuous second cell source line 12 is connected in the second interconnect layer. Thus, interconnect resistance from the cell source drivers 60a and 60b to the first cell source lines 11a through 11e is reduced. As a result, interconnect resistance from the cell source drivers 60a and 60b to the select transistors is reduced.

Figure 4A:
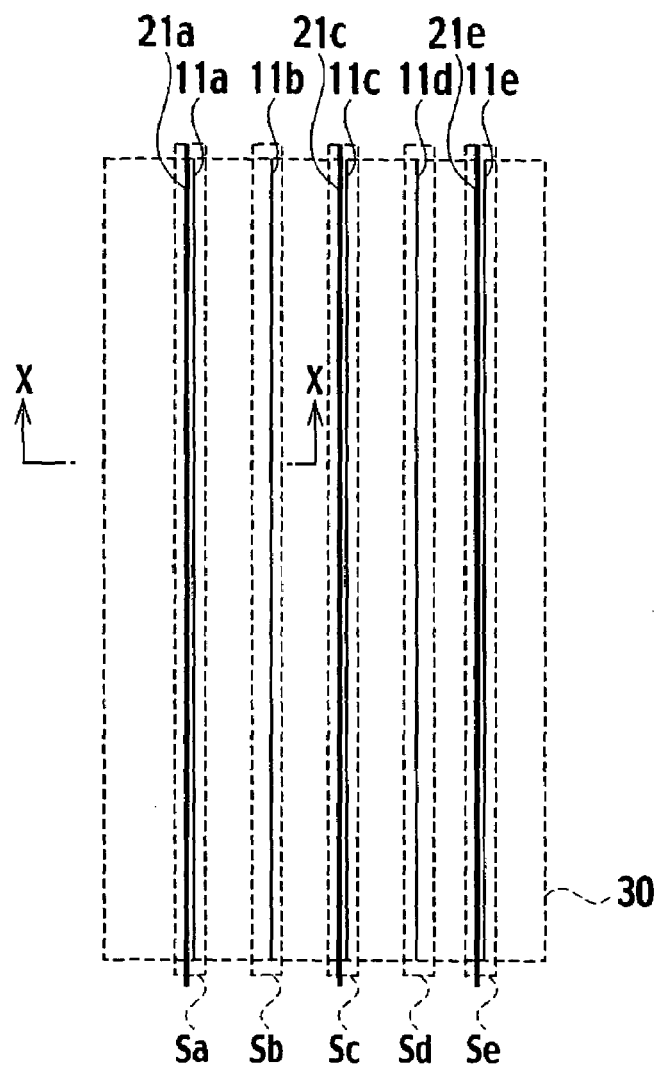
FIG. 4A shows a top plan view of the first interconnect layer of a NAND-type nonvolatile semiconductor memory according to the first embodiment of the present invention.
Figure 4B:
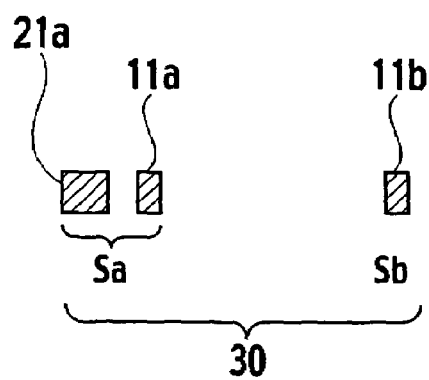
FIG. 4B shows a sectional view along a X-X direction of FIG. 4A.

FIGS. 4A and 4B show a pattern of the first interconnect layer shown in FIGS. 2 and 3. FIG. 4A is a top plan view of the first interconnect layer of the NAND-type nonvolatile semiconductor memory 100 according to the first embodiment of the present invention. FIG. 4B schematically shows a sectional view along a X-X direction of FIG. 4A. The first cell well line 21a and the first cell source line 11a are arranged above the shunt region Sa. The first cell source line 11b is arranged above the shunt region Sb. The first cell well line 21c and the first cell source line 11c are arranged above the shunt region Sc. The first cell source line 11d is arranged above the shunt region Sd. The first cell well line 21e and the first cell source line 11e are arranged above the shunt region Se. The shunt regions Sa, Sc, and Se, on which the first cell well lines 21a, 21c and 21e and the first cell source lines 11a through 11e are arranged, and the shunt regions Sb and Sd, on which only the first cell source lines 11a through 11e are arranged, are alternately arranged.

Figure 5:
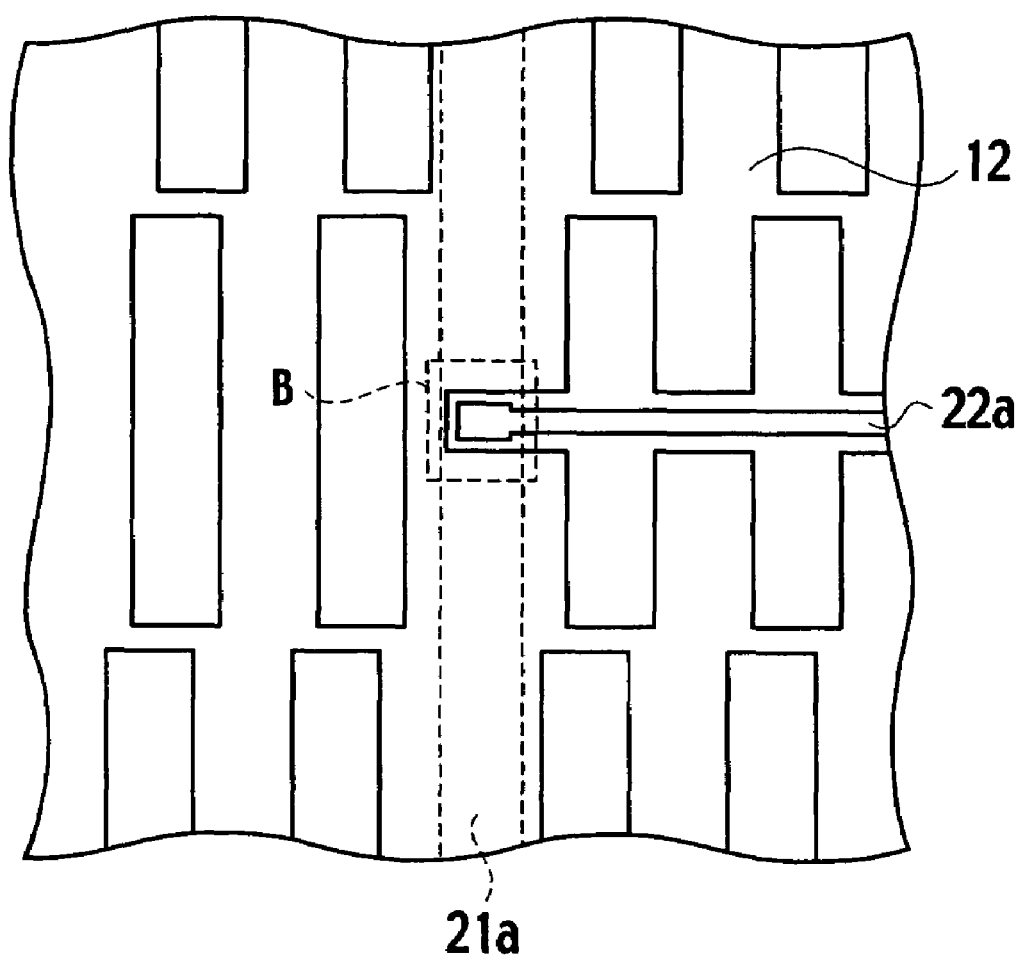
FIG. 5 shows a magnified view of a part of FIG. 1.

FIG. 5 is a magnified view of a region A1 in FIG. 1. The region A1 is a magnified view of one end of the second cell well line 22a. The first cell well line 21a is arranged in the first interconnect layer below the second interconnect layer in which the second cell well lines 22a through 22h and the second cell source line 12 are arranged. As shown in FIG. 5, the first cell well line 21a extends directly below the end of the second cell well line 22a in a direction perpendicular to the second cell well line 22a. The first cell well line 21c, which is not shown in the drawing, also extends directly below the other end of the second cell well line 22a in a direction perpendicular to the second cell well line 22a. The second cell source line 12 surrounds the second cell well lines 22a through 22h. As shown in FIG. 5, the second cell source line 12 is not arranged throughout the region where the second cell well lines 22a through 22h are not arranged, but is arranged in a mesh configuration.

Figure 6A:
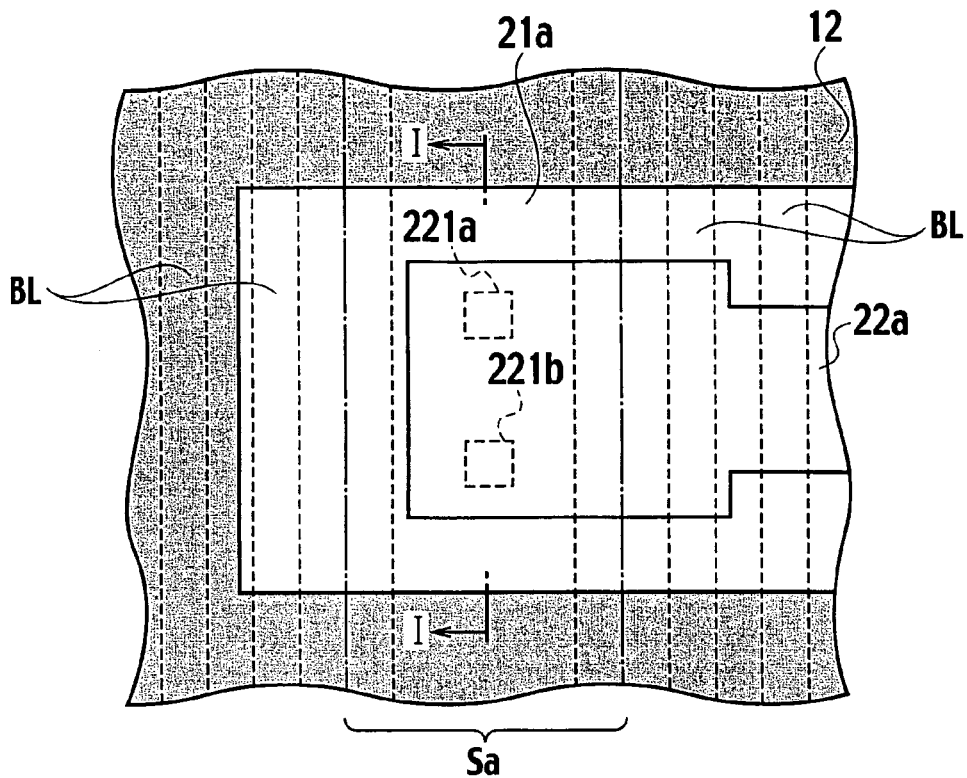
FIG. 6A shows a magnified view of the first and second interconnect layer arranged in a part of FIG. 5.
Figure 6B:
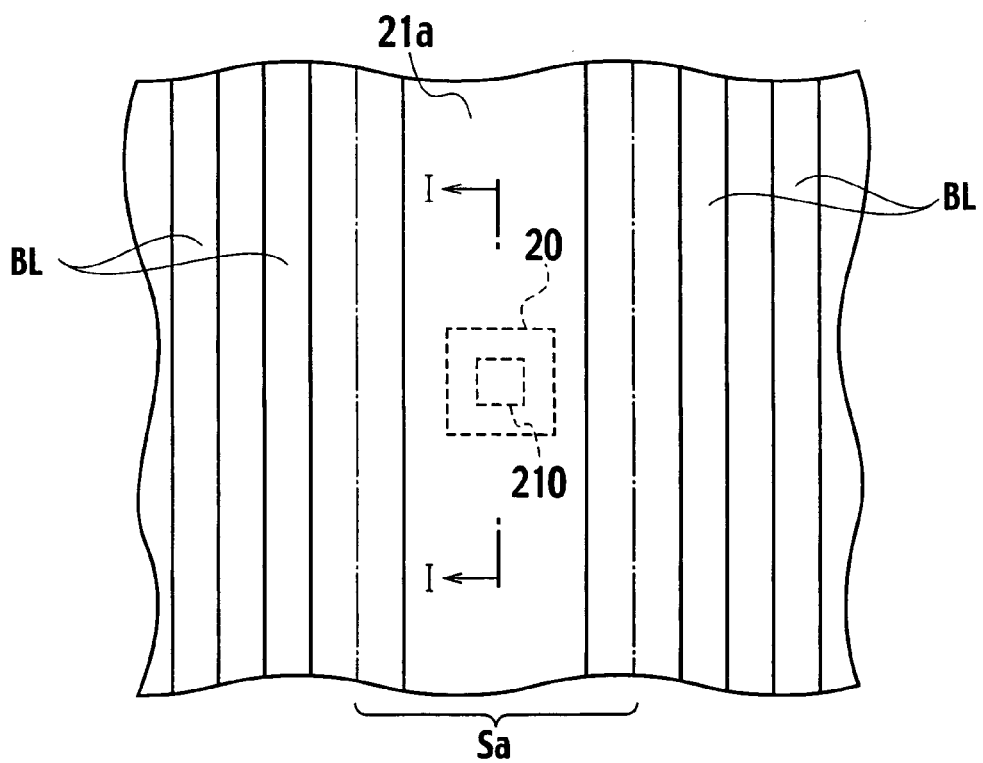
FIG. 6B shows a magnified view of the first interconnect layer in a part of FIG. 5.

FIGS. 6A and 6B are magnified views of a region B in FIG. 5. FIG. 6A is a top plan view of the first and the second interconnect layer in the region B. FIG. 6B is a top plan view of the first interconnect layer in the region B. The first cell well line 21a is arranged above the shunt region Sa shown by alternate long and short dashed lines in FIG. 6A. In addition, vias 221a and 221b, which connect the first cell well line 21a and the second cell well line 22a, are arranged at the end of the second cell well line 22a. The first cell well line 21a is arranged in the first interconnect layer in which bit lines BL are arranged. As shown in FIG. 6B, a cell well line (hereafter, referred to as 'M0 cell well line') 20 is arranged in a cell interconnect layer and is connected to the first cell well line 21a through a via 210 below the end of the second cell well line 22a.

Figure 7:
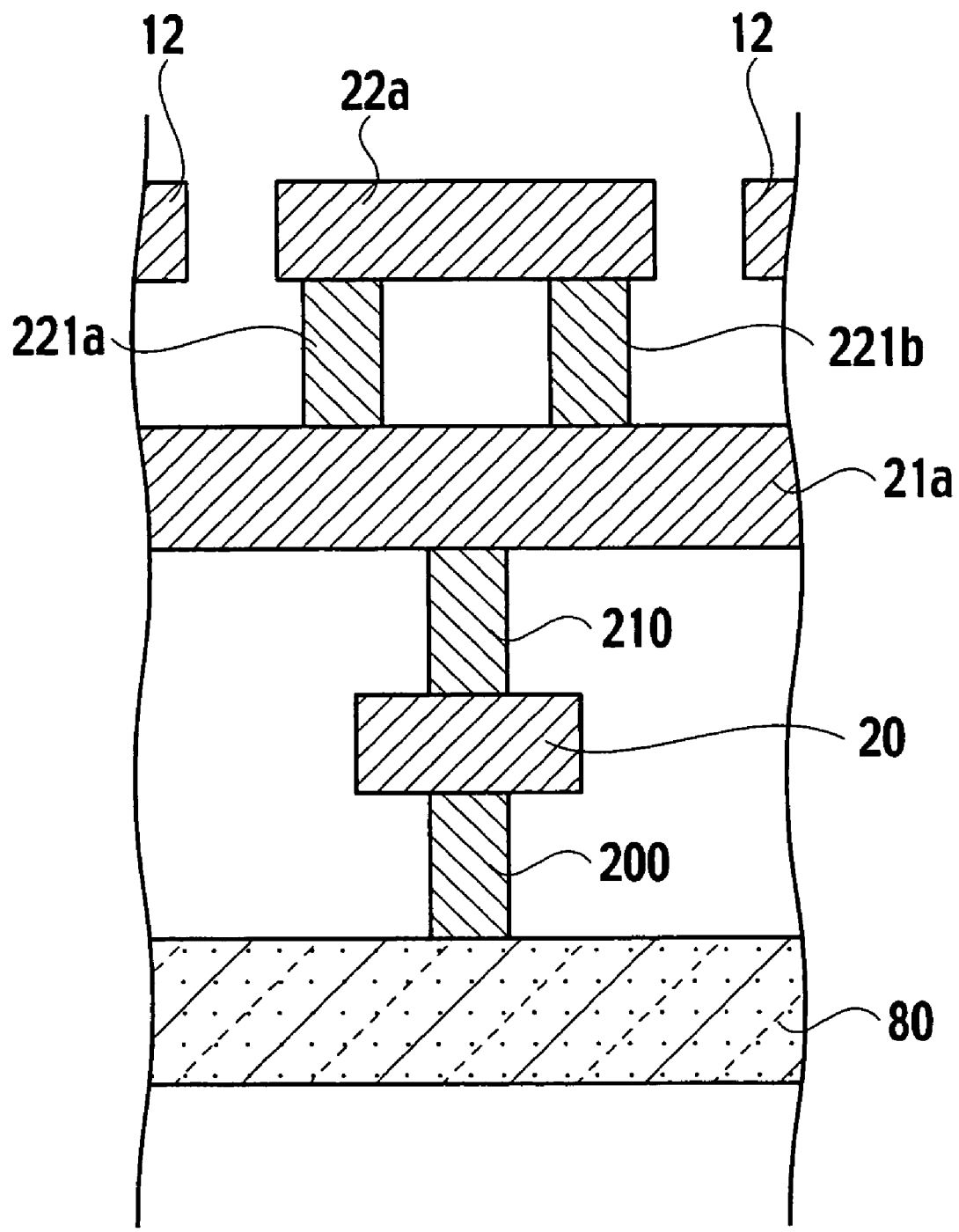
FIG. 7 shows a sectional view along a I-I direction of FIG. 6A and FIG. 6B.

FIG. 7 shows a sectional view along the I-I direction of FIGS. 6A and 6B. The second cell well line 22a is connected to the first cell well line 21a through the vias 221a and 221b. The second cell well line 22a is connected to the first cell well line 21c at the other end of the second cell well line 22a, which is not shown in the drawing. The first cell well line 21a is connected to the M0 cell well line 20 through the via 210. The M0 cell well line 20 is connected to a shunt region on the p-well region 80 through a via 200. In other words, the p-well region 80 and the second cell well line 22a are electrically connected. Memory cell transistors, not shown in the drawing, are formed in the p-well region 80.

Figure 8A:
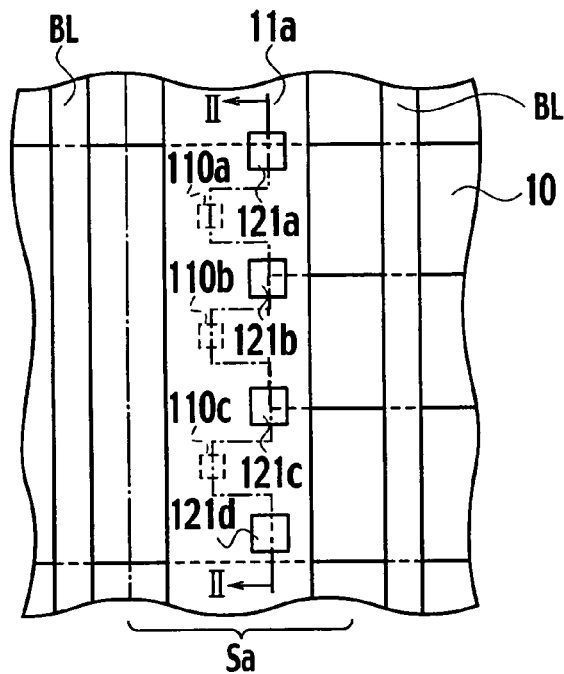
FIG. 8A shows a schematic structure of cell source lines of a NAND-type nonvolatile semiconductor memory according to the first embodiment of the present invention.
Figure 8B:
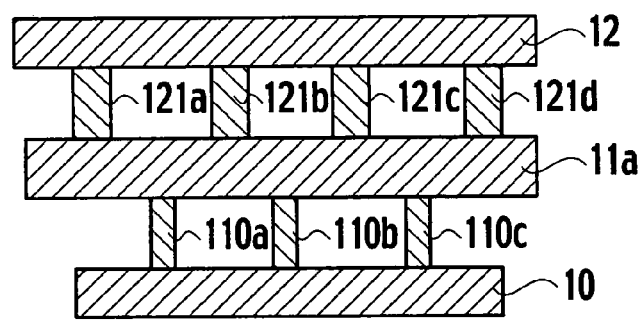
FIG. 8B shows a sectional view along a II-II direction of FIG. 8A.

FIGS. 8A and 8B show exemplary cell source lines above the shunt region Sa. Note that the second cell source line 12 is not shown in FIG. 8A. The first cell source line 11a is arranged above the shunt region Sa shown by alternate long and short dashed lines and is connected to an M0 cell source line 10 through the vias 110a through 110c. The M0 cell source line 10 is arranged in the cell interconnect layer. The second cell source line 12 and the first cell source line 11a are connected through the vias 121a through 121d. As described later, the M0 cell source line 10 is connected to the source terminal of a select transistor included in the memory cell array 30, and the operation of the select transistor included in the memory cell array 30 is controlled by the potential of the M0 cell source line 10.

Figure 8C:
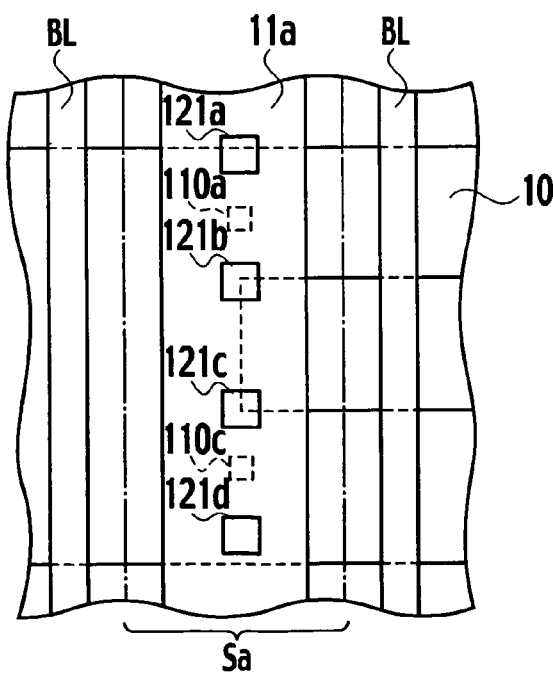
FIG. 8C shows a schematic structure of cell source lines of a NAND-type nonvolatile semiconductor memory according to the first embodiment of the present invention.

As shown in FIG. 8C, the vias 110a through 110c and 121a through 121d may be arranged so as to be linearly aligned in parallel along the length of the bit line BL. The width of the first cell source line 11a is reduced so as to be narrower than that in FIG. BA. As a result, it is possible to reduce the width of the shunt region Sa, allowing an increase in the number of the bit lines BL.

Figure 9:
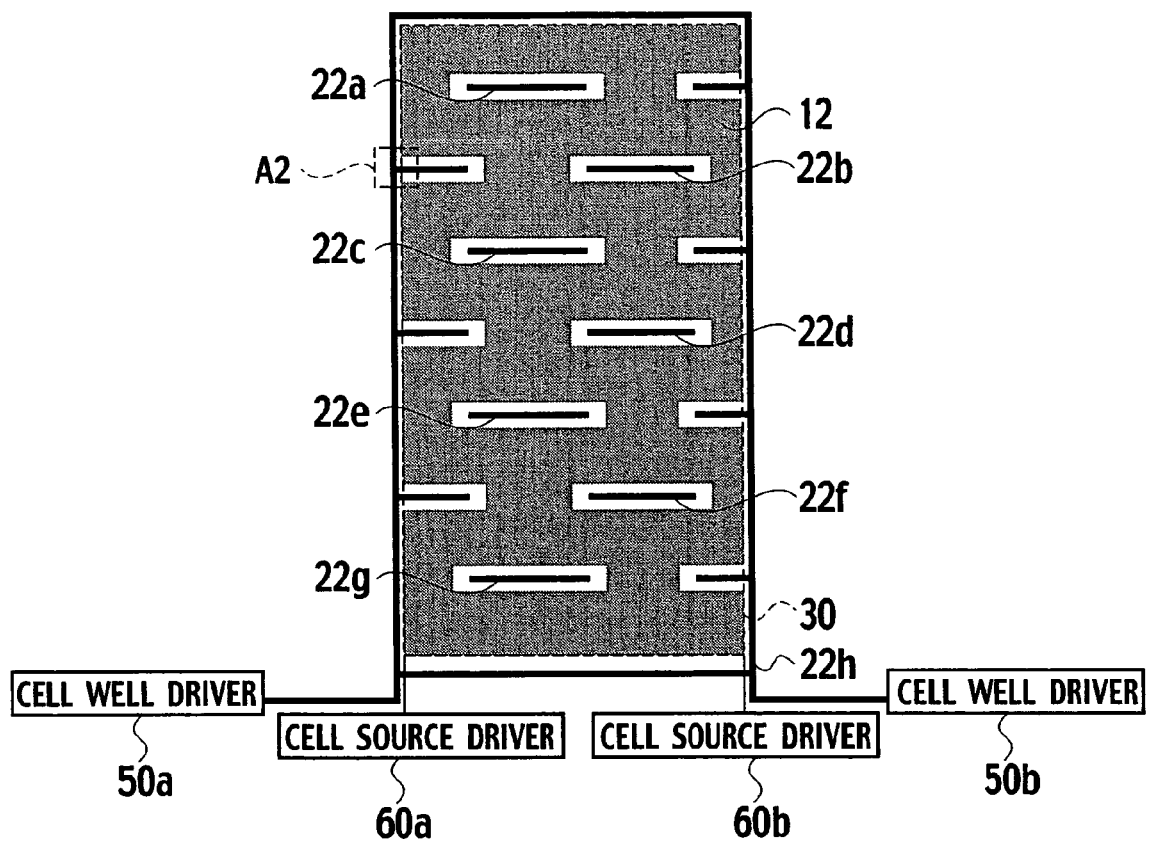
FIG. 9 shows a schematic structure of the second interconnect layer of a NAND-type nonvolatile semiconductor memory according to the first embodiment of the present invention.
Figure 10A:
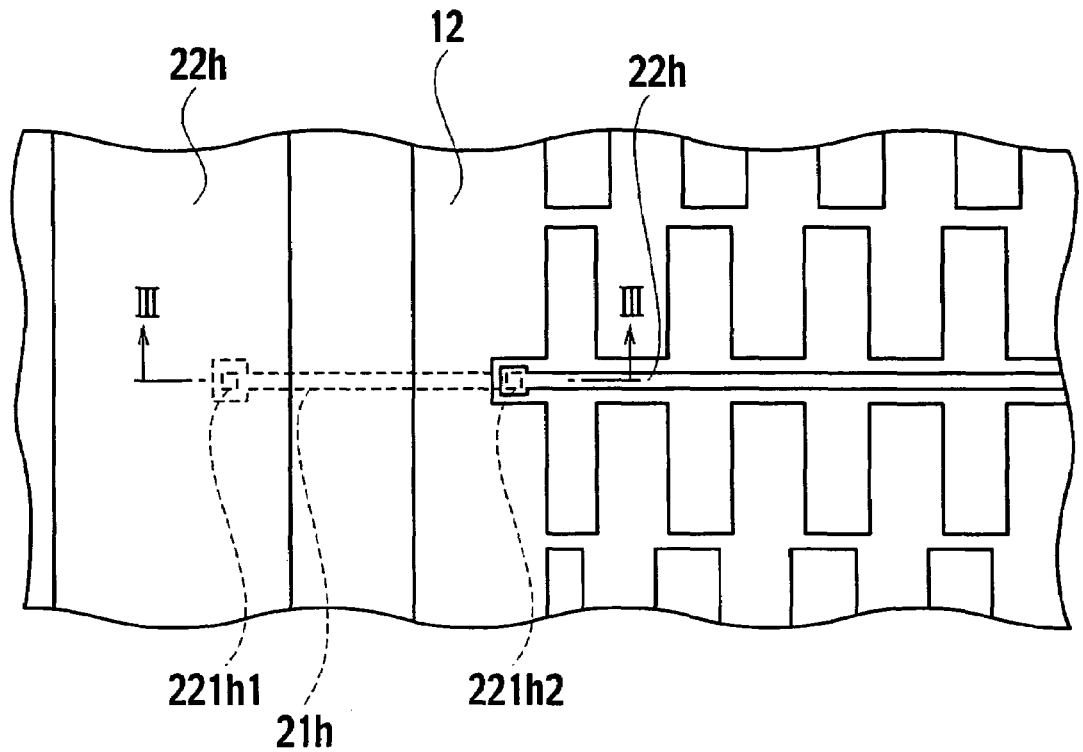
FIG. 10A shows a schematic structure of the outer region of the memory cell array of a NAND-type nonvolatile semiconductor memory according to the first embodiment of the present invention.
Figure 10B:
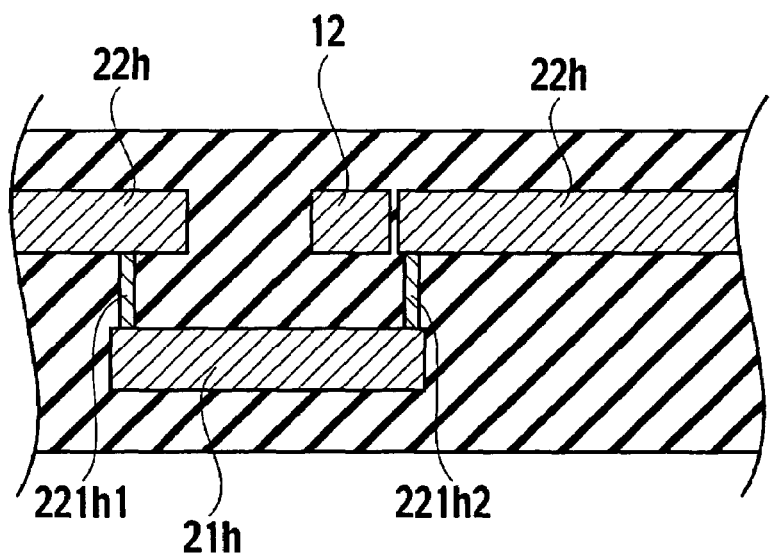
FIG. 10B shows a sectional view along a III-III direction of FIG. 10A.

FIG. 9 shows a pattern of the second interconnect layer shown in FIGS. 2 and 3. As shown in FIG. 9, the second cell well line 22h is arranged in a ring shape on the outer region of the memory cell array 30 shown by a dashed line. FIGS. 10A and 10B are magnified views of a region A2 in FIG. 9. As shown in FIGS. 10A and 10B, the second cell well line 22h is connected to the first cell well line 21h, arranged in the first interconnect layer, through vias 221h1 and 221h2. Accordingly, the second cell source line 12 is not separated by the second cell well line 22h in the outer region of the memory cell array 30.

Figure 11:
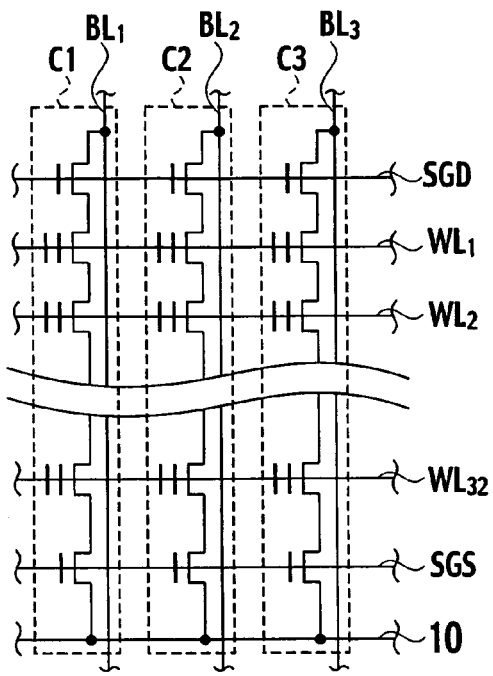
FIG. 11 shows an equivalent circuit of the memory cell array according to the first embodiment of the present invention.

FIG. 11 shows an example of the memory cell array 30. The memory cell array 30 shown in FIG. 11 is configured with horizontally aligned memory cell columns C1, C2, C3, . . . in which a plurality of memory cell transistors are vertically aligned. The operation of the NAND-type nonvolatile semiconductor memory 100 that includes the memory cell array 30 is described below. The memory cell transistors, which are included in the memory cell columns C1, C2, C3, . . . , respectively, are connected in series. Each of the memory cell columns C1, C2, C3, . . . , defines a NAND cell.

FIG. 11 shows a part of an equivalent circuit of the memory cell array 30. As shown in FIG. 11, the memory cell array 30 includes vertically aligned bit lines BL1, BL2, BL3, . . . , and horizontally aligned word lines WL1, WL2, . . . , WL32 that are perpendicular to the bit lines BL1, BL2, BL3, . . . . Memory cell transistors having respective charge accumulation layers, which have respective charge accumulated levels controlled by any one of the word lines WL1, WL2, . . . , WL32, are vertically aligned. The control gate potentials of the memory cell transistors may be set by adjusting the potentials of the word lines WL1, WL2, . . . , WL32. Bit line side select transistors and source line side select transistors, which are arranged vertically adjacent to one another and select a group of aligned memory cell transistors, are arranged on both ends of the aligned memory cell transistors. The gate terminals of the bit line side select transistors are connected to a gate line SGD, and the drain terminals thereof are connected to the bit lines BL1, BL2, BL3, . . . . The gate terminals of the source line side select transistors are connected to a gate line SGS, and the source terminals thereof are connected to the M0 cell source line 10.

Figure 12:
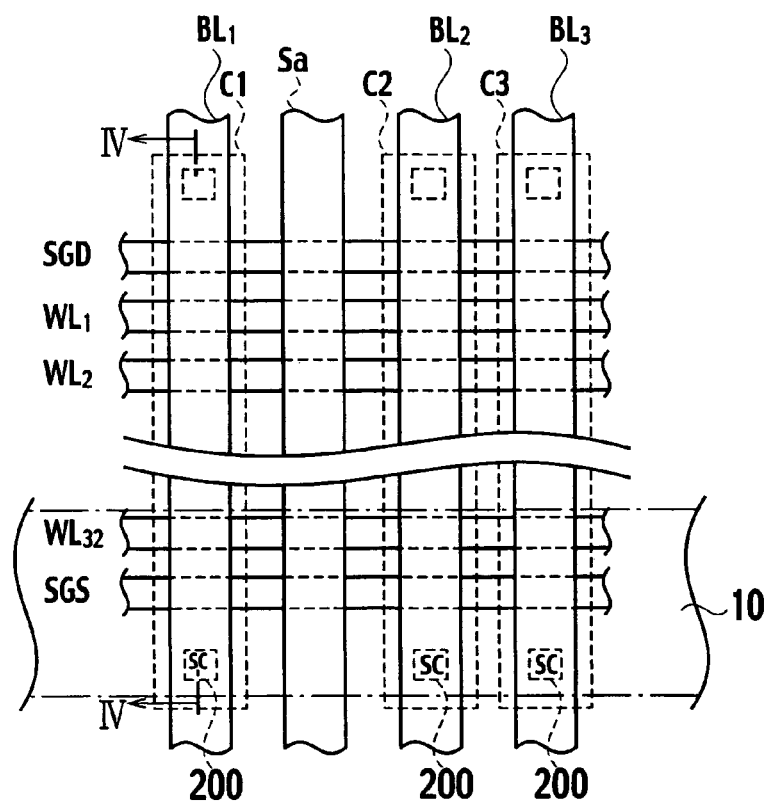
FIG. 12 shows a top plan view of a part of the memory cell array corresponding to FIG. 11.

FIG. 12 is a top plan view of the memory cell array corresponding to FIG. 11. As shown in FIG. 12, the drain terminals of the bit line side select transistors are connected to the bit lines BL1, BL2, BL3, . . . through vias BC. The source terminals of the source line side select transistors are connected through vias SC to the M0 cell source line 10 shown by alternate long and short dashed lines. The vertically extending bit lines BL1, BL2, BL3, . . . are arranged at the same intervals as intervals of the memory cell columns C1, C2, C3, . . . in a horizontal direction. The vertically extending shunt region Sa in parallel with the bit lines BL1, BL2, BL3, . . . is arranged between the memory cell column C1 connected to the bit line BL1 and the memory cell column C2 connected to the bit line BL2. As mentioned above, no bit lines are arranged above the shunt region Sa.

Figure 13:
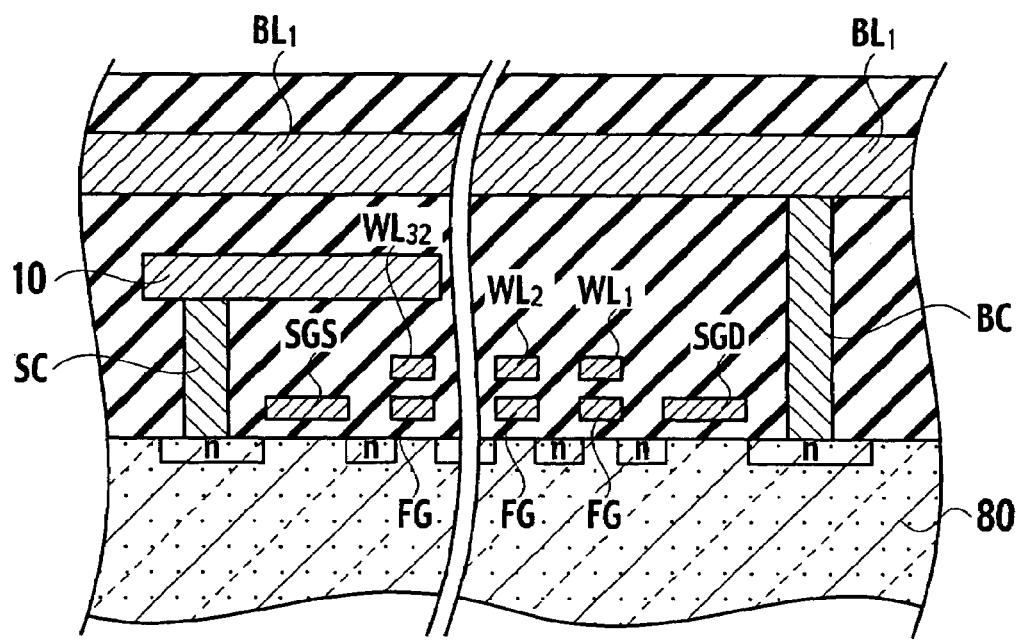
FIG. 13 shows a sectional view along a IV-IV direction of FIG. 12.

FIG. 13 is a sectional view along the IV-IV direction of FIG. 12. Diffusing regions of memory cell transistors, bit line side select transistors, and source line side select transistors included in the memory cell column C1 are formed within the p-well region 80. 'FG' in FIG. 13 denotes a floating gate of the memory cell transistor. The bit lines BL1, BL2, BL3, . . . are arranged in the first interconnect layer. As described using FIG. 8B, the M0 cell source line 10 is connected to the second cell source line 12 through the vias 110a, 110c, and 121a through 121d. In other words, the M0 cell source line 10 is connected to the cell source drivers 60a and 60b shown in FIG. 9. The p-well region 80 is connected to the cell well drivers 50a and 50b shown in FIG. 9 through the first cell well line 21a and the second cell well line 22a and the like.

The operation of the memory cell array 30 shown in FIG. 11 is described below. The read operation of the memory cell transistors included in the memory cell column C1 is exemplified in the following description. In the read operation, the bit line BL1, which is connected to the drain electrodes of target memory cell transistors to be read, is precharged, and 0 V is applied to the M0 cell source line 10 connected to the source electrodes thereof. Subsequently, voltage is applied to the word lines WL1, WL2, . . . , WL32, respectively, so as to turn on all memory cell transistors in the memory cell column C1, other than the target memory cell transistors to be read. Afterwards, a voltage for the read operation is applied to the word lines WL1, WL2, . . . , WL32, which are connected to the control gates of the target memory cell transistors to be read. At this time, when the target memory cell transistors to be read are in conductive states, current flows from the bit line BL1 to the M0 cell source line 10. As a result, the potential of the bit line BL1 decreases. When the target memory cell transistors to be read are not in conductive states, the potential of the bit line BL1 does not change. In other words, change in the potential of the bit line BL1 indicates that data is read from the target memory cell transistors.

As mentioned above, when the interconnect resistance from the cell source drivers 60a and 60b to the M0 cell source line 10 is high, the potential of the M0 cell source line 10 changes from 0 V to a positive voltage. As a result, change in the potentials of the bit lines BL1, BL2, BL3, . . . is small, and thus change in the potentials of the bit lines BL1, BL2, BL3, . . . may not be detected.

Figure 14:
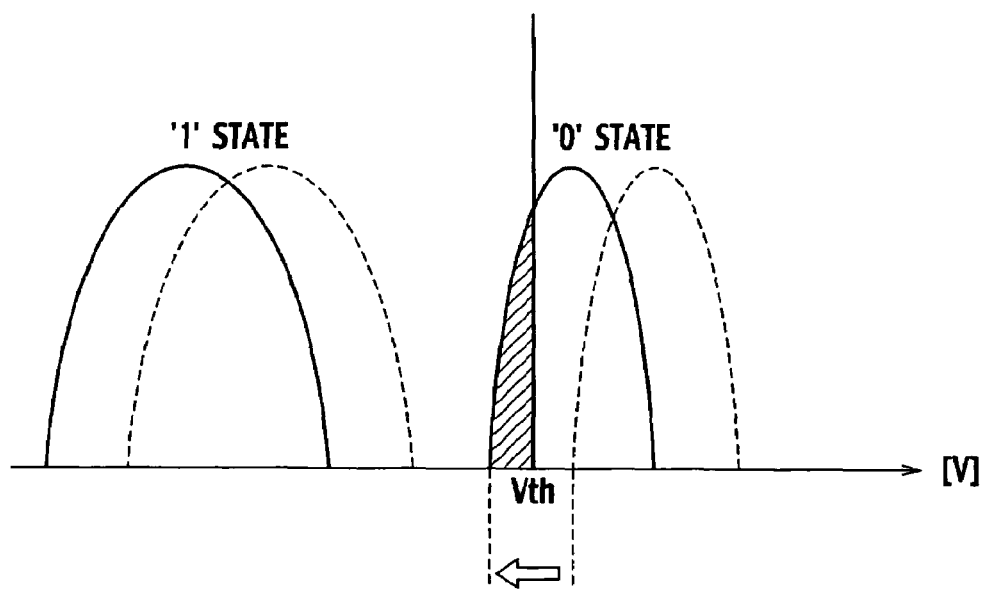
FIG. 14 shows a graph for explaining a change of a distribution of threshold voltage of the memory cell transistor.

When the interconnect resistance of the cell well lines from the cell well drivers 50a and 50b to the p-well region 80 is high, the potential of the p-well region 80, which should be fixed to 0V during a read operation, changes to a positive voltage. In such case, the threshold voltages of the memory cell transistors are lower than in the case where the potential of the p-well region 80 is 0V, due to a back bias effect. FIG. 14 shows a distribution of threshold voltages of the memory cell transistors. In FIG. 14, the '1' state indicates that no electrons have accumulated in the floating gates while the '0' state indicates that electrons have accumulated in the floating gates. The vertical axis in FIG. 14 indicates the number of memory cell transistors. Dashed lines show a distribution of the threshold voltages of the memory cell transistors when the potential of the p-well region 80 is 0V. On the other hand, a solid line shows a distribution of the threshold voltages of the memory cell transistors when the potential of the p-well region 80 is positive. As shown in FIG. 14, when the potential of the p-well region 80 becomes positive, the threshold voltages of some of the memory cell transistors in a '0' state may be lower than a threshold voltage Vth, which is a criterion for determining whether the state of the memory cell transistor is either the '0' state or the '1' state. In such case, the memory cell transistors in the '0' state included in a diagonally shaded part of the distribution shown in FIG. 14 are determined to be in the '1' state.

Figure 15:
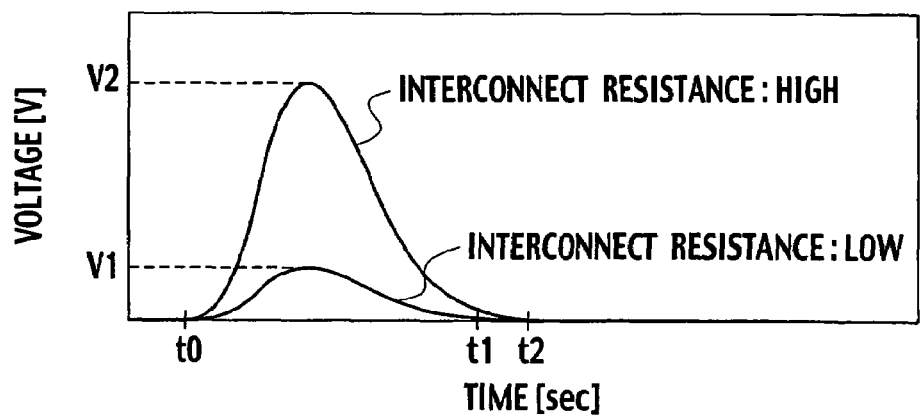
FIG. 15 shows a graph for explaining an effect of noise voltage reduction by a NAND-type nonvolatile semiconductor memory according to the first embodiment of the present invention.

When the interconnect resistance of the cell well lines is high, the recovery time from change in signals, which are transferred through the cell well lines, due to coupling noise or the like becomes longer. FIG. 15 shows voltage levels when coupling noise occurs on signals transferred through the cell well lines. As shown in FIG. 15, in the case where noise occurs at a time t0, when the interconnect resistance of the cell well lines is high, noise with a voltage V2 occurs, and the voltage goes down to zero at a time t2. Noise at a voltage V1, which occurs when the interconnect resistance of the cell well lines is low, is lower than the voltage V2. Moreover, a time t1 at which the noise disappears when the interconnect resistance of the cell well line is low is earlier than the time t2. In other words, the recovery time when a noise occurs is so short that the interconnect resistance of the cell well lines is small.

As mentioned above, the interconnect resistance of the cell source lines including the second cell source line 12, the first cell source lines 11a through 11e, and the M0 cell source line 10, and interconnect resistance of the cell well lines including the second cell well lines 22a through 22h, the first cell well lines 21a, 21c, and 21e, and the M0 cell well line 20 is required to be reduced so that the performance of the NAND-type nonvolatile semiconductor memory 100 can be improved. The sheet resistance of the second cell source line 12 and the second cell well lines 22a through 22h, which are arranged in the second interconnect layer, is set lower than the sheet resistance of the first cell source lines 11a through 11e and the first cell well lines 21a, 21c, and 21e, which are arranged in the first interconnect layer.

The second interconnect layer may be made of an aluminum (Al) film, a copper (Cu) film, or the like. The sheet resistance of the second interconnect layer is approximately 0.07 ohm. The first interconnect layer may be made of an Al film, a Cu film, or the like. The sheet resistance of the first interconnect layer is approximately 1 ohm. The sheet resistance per unit area of the cell interconnect layer is approximately 5 ohms. The cell interconnect layer may be made of a tungsten (W) film or the like.

According to the NAND-type nonvolatile semiconductor memory 100, arranging the second cell well lines 22a through 22h in the second interconnect layer reduces interconnect resistance of the cell well lines. The second cell source line 12 is arranged in the second interconnect layer, which is not separated by the second cell well lines 22a through 22h. Thus, the interconnect resistance of the cell source lines is reduced. In other words, according to the NAND-type nonvolatile semiconductor memory 100 shown in FIG. 1, it is possible to reduce both the interconnect resistance of the cell source lines and the cell well lines. A high-performance NAND-type nonvolatile semiconductor memory 100 having a short recovery time for coupling noise or the like is possible.

Reduction in the interconnect resistance of the cell source lines and the cell well lines allows reduction in the load drivability of the cell source drivers 60a and 60b and the cell well drivers 50a and 50b. As a result, the size of the cell source drivers 60a and 60b and the cell well drivers 50a and 50b are reduced. Since arrangement of the second cell well lines 22a through 22h reduces the interconnect resistance of the cell well lines, it is possible to reduce the number of first cell well lines 21a, 21c, and 21e. Thus, the area of the shunt region arranged in the memory cell array 30 is reduced. As a result, the chip area of the NAND-type nonvolatile semiconductor memory 100 may be reduced. Alternatively, integration of the memory cell transistors in the memory cell array 30 may be improved.

Figure 16:
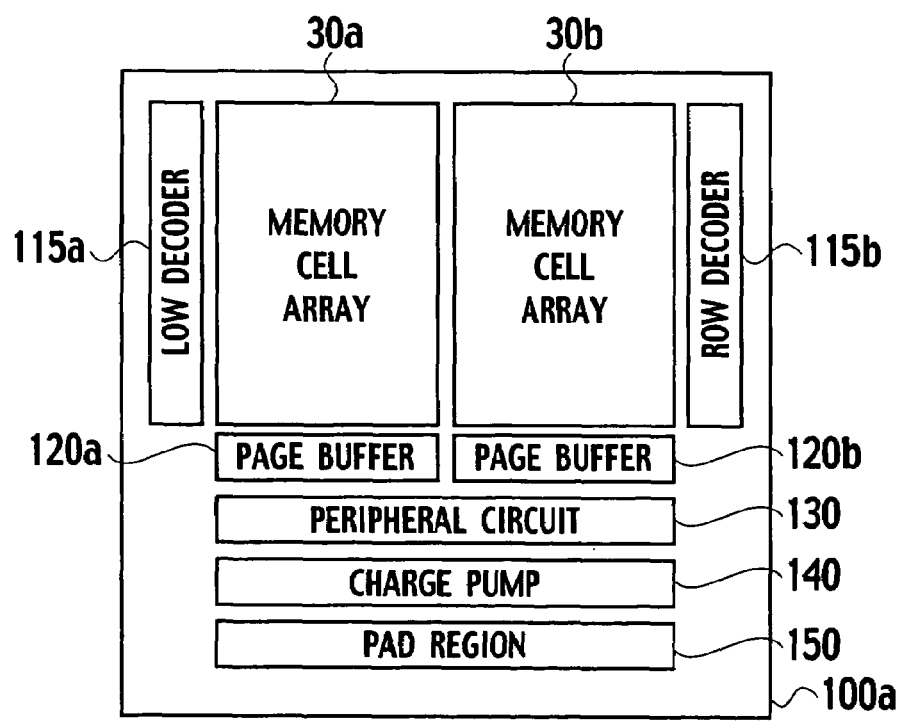
FIG. 16 shows another schematic structure of a NAND-type nonvolatile semiconductor memory according to the first embodiment of the present invention.

FIG. 16 shows an exemplary configuration of NAND-type nonvolatile semiconductor memory 100a including peripheral circuits according to the first embodiment of the present invention. The NAND-type nonvolatile semiconductor memory 100a shown in FIG. 16 includes memory cell arrays 30a and 30b, peripheral circuits such as row decoders 115a and 115b, page buffers 120a and 120b, a peripheral circuit 130, and a charge pump 140, and a pad region 150. The memory cell array 30a is controlled by the row decoder 115a and the page buffer 120a. The memory cell array 30b is controlled by the row decoder 115b and the page buffer 120b.

As shown in FIG. 16, arrangement of the pad region 150 only on the lower side of the NAND-type nonvolatile semiconductor memory 100a reduces the area of the NAND-type nonvolatile semiconductor memory 100a. Note that the cell well drivers 50a and 50b and the cell source drivers 60a and 60b are required to be arranged at the bottom of the NAND-type nonvolatile semiconductor memory 100a so that the pad region 150 is arranged only on the lower side of the NAND-type nonvolatile semiconductor memory 100a. In such case, the respective interconnect lengths from the cell well drivers 50a and 50b and the cell source drivers 60a and 60b to control transistors arranged in the regions above the memory cell arrays 30a and 30b increase. As a result, when the interconnect resistance of the cell source lines and the cell well lines is high, a malfunction may easily occur in the memory cell columns arranged in the regions above the memory cell arrays 30a and 30b. According to the related art, design techniques to impair performance are adopted to prevent such a malfunction.

However, according to the NAND-type nonvolatile semiconductor memory 100a shown in FIG. 16, reduction in area is possible without impairing the performance of the semiconductor memory. For example, as shown in FIG. 5, arrangement of the second cell source line 12 in a stair mesh configuration reduces the interconnect length from the cell source drivers 60a and 60b to the region above the memory cell arrays 30a and 30b to be shorter than in the case where the second cell source line 12 is arranged in a matrix mesh configuration. The mesh configuration of the second cell source line 12 is modified in accordance with the layout of the cell source drivers 60a and 60b. The horizontal and vertical intervals of the second cell source line 12 arranged in mesh configuration may be approximately 2 to 10 μm.

The second cell source line 12 and the second cell well lines 22a through 22h, shown in FIG. 1, are arranged in the second interconnect layer above the memory cell arrays 30a and 30b. A bus interconnect and a power supply interconnect are arranged in the second interconnect layer of the peripheral circuits, such as the row decoders 115a and 115b, the page buffers 120a and 120b, the peripheral circuit 130, or the charge pump 140. The first cell well lines 21a, 21c, and 21e, and the bit lines BL1, BL2, BL3, . . . , shown in FIG. 1, are arranged in the first interconnect layer above the memory cell arrays 30a and 30b. Inter-block interconnects are arranged in the first interconnect layer of the peripheral circuits. The M0 cell source line 10 and the M0 cell well line 20 are arranged in the cell interconnect layer above the memory cell arrays 30a and 30b. Inter-block interconnects are arranged in an interconnect layer of the peripheral circuits corresponding to the cell interconnect layer.

<First Modification>

Figure 17:
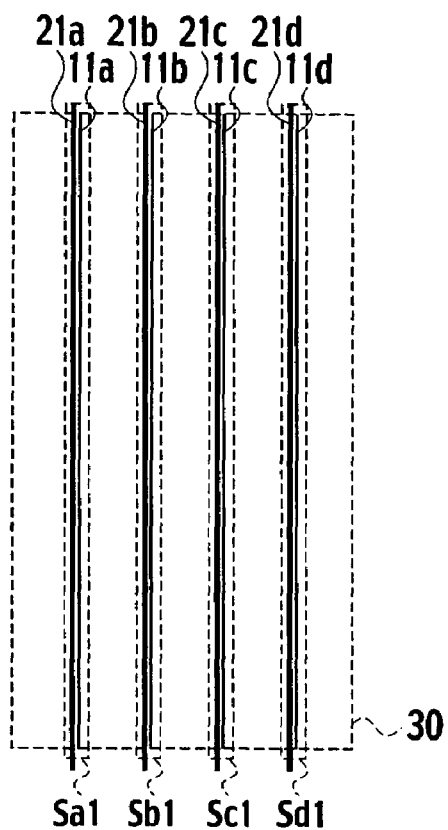
FIG. 17 shows a schematic structure of the first interconnect layer of a NAND-type nonvolatile semiconductor memory according to the first modification of the first embodiment of the present invention.

FIG. 17 shows a first interconnect layer of a NAND-type nonvolatile semiconductor memory 100 according to a first modification of the first embodiment of the present invention. As shown in FIG. 17, what is different from FIG. 4A is that the first cell well lines 21a through 21d and the first cell source lines 11a through 11d are arranged on respective shunt regions Sa1 through Sd1. In other words, the first cell well line 21a and the first cell source line 11a are arranged above the shunt region Sa1. The first cell well line 21b and the first cell source line 11b are arranged above the shunt region Sb1. The first cell well line 21c and the first cell source line 11c are arranged above the shunt region Sc1. The first cell well line 21d and the first cell source line 11d are arranged above the shunt region Sd1.

Arrangement of the first cell well lines 21b and 21d on the respective shunt regions Sb1 and Sd1 increases the width of the shunt regions Sb1 and Sd1 to be wider than the width of the shunt regions Sb and Sd shown in FIG. 4A. However, arrangement of the firs cell well lines 21b and 21d reduces the interconnect resistance of the cell well lines, resulting in reduction in the shunt region Se. In other words, since a greater reduction in the number of shunt regions, as compared to the case of FIG. 4A is possible, a reduction in the area of the shunt regions in the memory cell array 30 is also possible.

<Second Modification>

Figure 18:
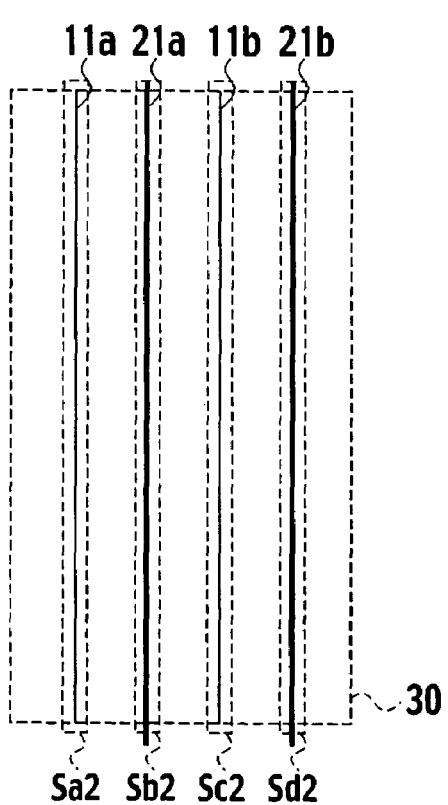
FIG. 18 shows a schematic structure of the first interconnect layer of a NAND-type nonvolatile semiconductor memory according to the second modification of the first embodiment of the present invention.

FIG. 18 shows a first interconnect layer of a NAND-type nonvolatile semiconductor memory 100 according to a second modification of the first embodiment of the present invention. As shown in FIG. 18, what is different from FIG. 4A is that a first cell source line 11a, a first cell well line 21a, a first cell source line 11c, and a first cell well line 21b are arranged on respective shunt regions Sa2 through Sd2. In other words, the first cell source lines 11a and 11b and the first cell well lines 21a and 21b are arranged on the respective shunt regions Sa2 through Sd2.

Since the number of first cell source lines 11a and 11b and the number of first cell well lines 21a and 21b is small, the width of the first cell source lines 11a and 11b and the first cell well lines 21a and 21b is required to be increased. This requires an increase in the width of the shunt regions Sa2 through Sd2. However, since a larger reduction in the number of shunt regions as compared to the case of FIG. 4A is possible, reduction in the area of the shunt regions in the memory cell array 30 is also possible.

SECOND EMBODIMENT

Figure 19:
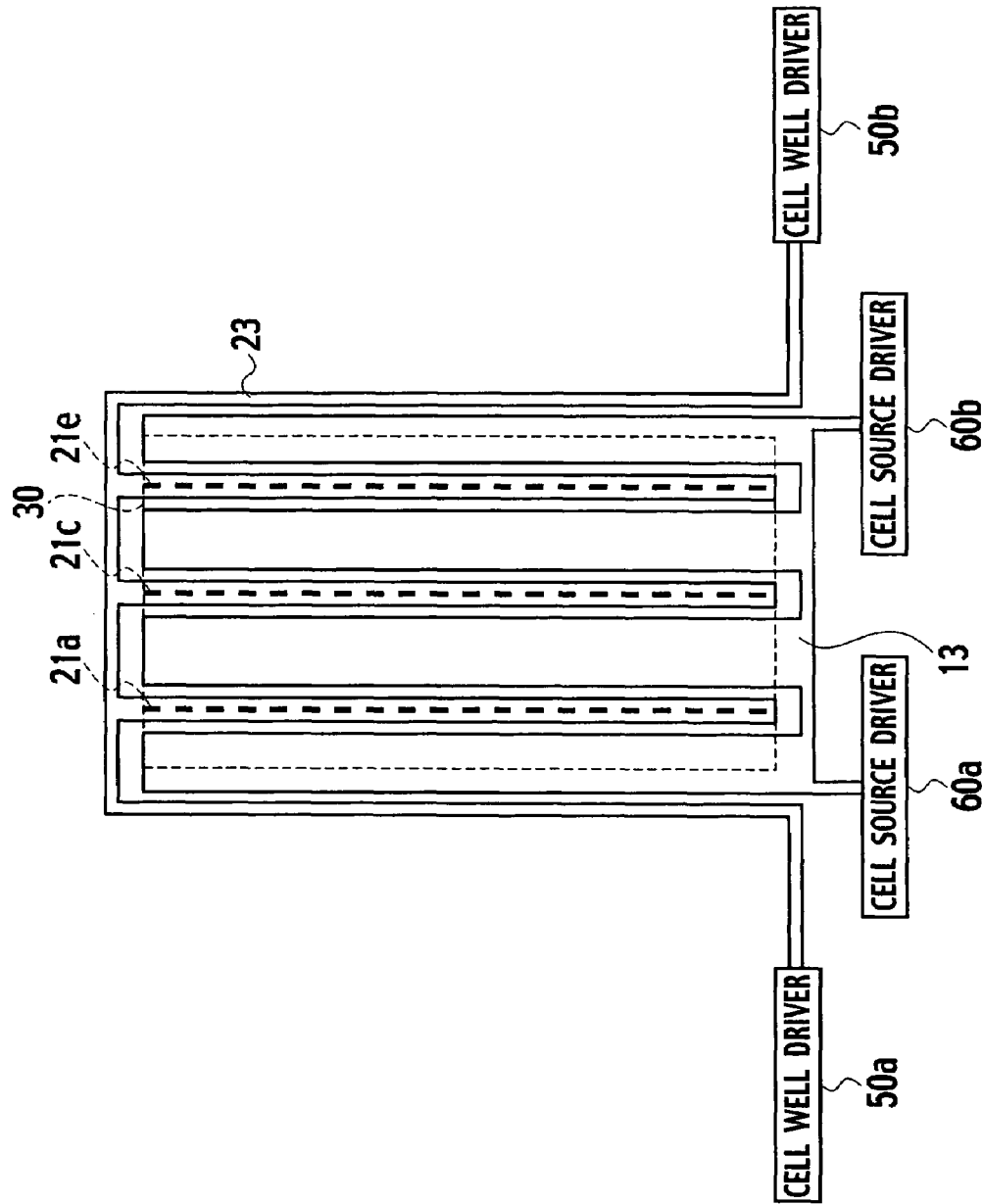
FIG. 19 shows a schematic structure of a NAND-type nonvolatile semiconductor memory according to a second embodiment of the present invention.

As shown in FIG. 19, a NAND-type nonvolatile semiconductor memory, according to the second embodiment of the present invention, includes a memory cell array 30 in which horizontally aligned memory cell columns are arranged, each including vertically aligned memory cell transistors and select transistors configured to select the memory cell transistors, a plurality of first cell well lines 21a, 21c, and 21e are connected to well regions, respectively, in which a plurality of memory cell columns are formed, a plurality of first cell source lines, which are connected to the source terminals of the respective select transistors in the plurality of memory cell columns, a second cell well line 23, which is arranged in an interconnect layer above the first cell well lines 21a, 21c, and 21e and electrically is connected to the first cell well lines 21a, 21c, and 21e to one another, and a second cell source line 13, which is arranged in an interconnect layer in which the second cell well line 23 is arranged so as to form an interdigital structure with the second cell well line 23 and which is connected to the first source lines.

Figure 20:
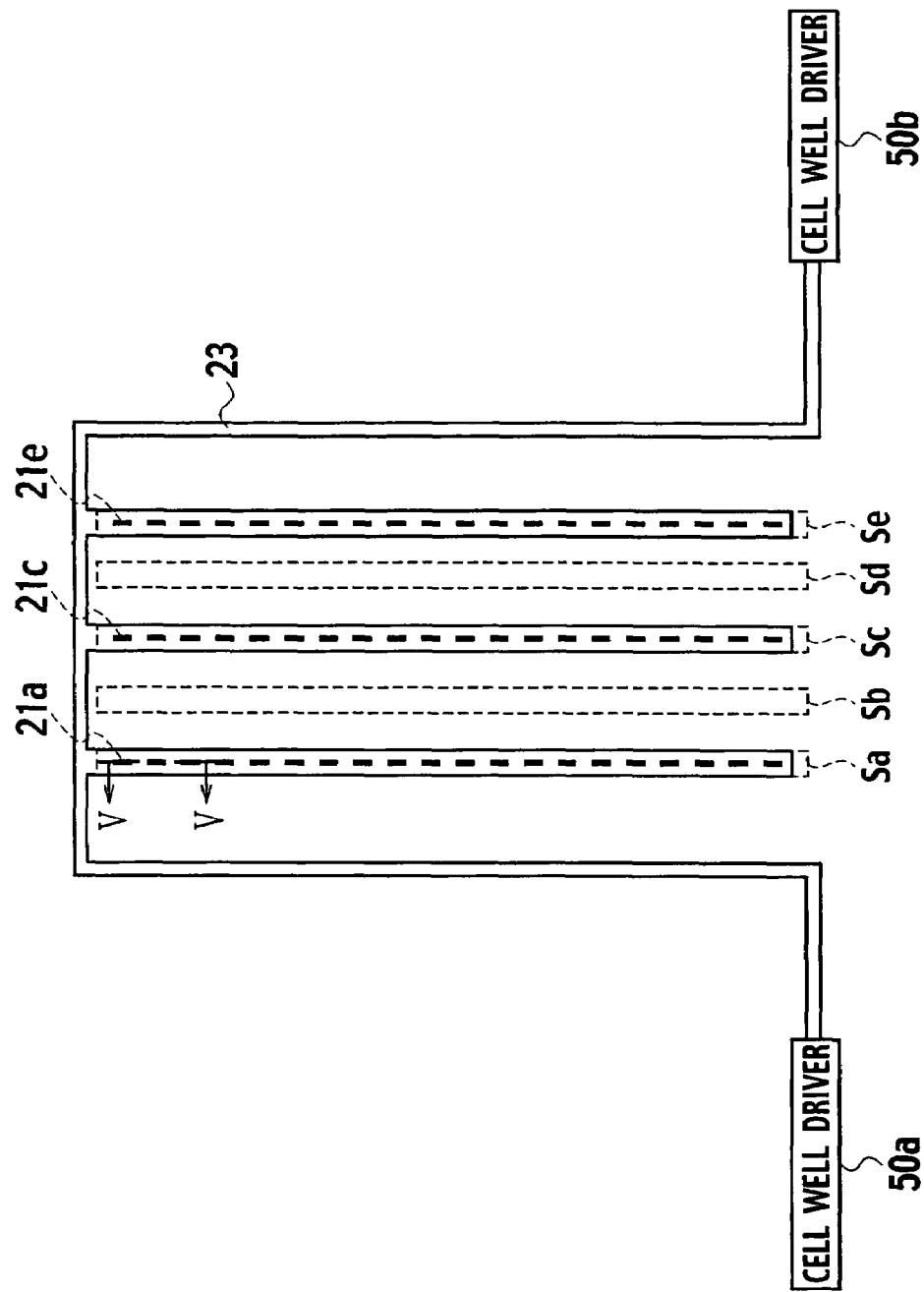
FIG. 20 shows a schematic structure of cell well lines of a NAND-type nonvolatile semiconductor memory according to the second embodiment of the present invention.

FIG. 20 shows an exemplary arrangement of the first cell well lines 21a, 21c, and 21e, and the second cell well line 23. The first cell well lines 21a, 21c, and 21e are arranged on respective shunt regions Sa, Sc, and Se. Vias connecting the first cell well lines 21a, 21c, and 21e to the second cell well line 23 are arranged above the shunt regions Sa, Sc, and Se. The first cell well lines 21a, 21c, and 21e are electrically connected to the second cell well line 23 on the shunt regions Sa, Sc, and Se.

Figure 21:
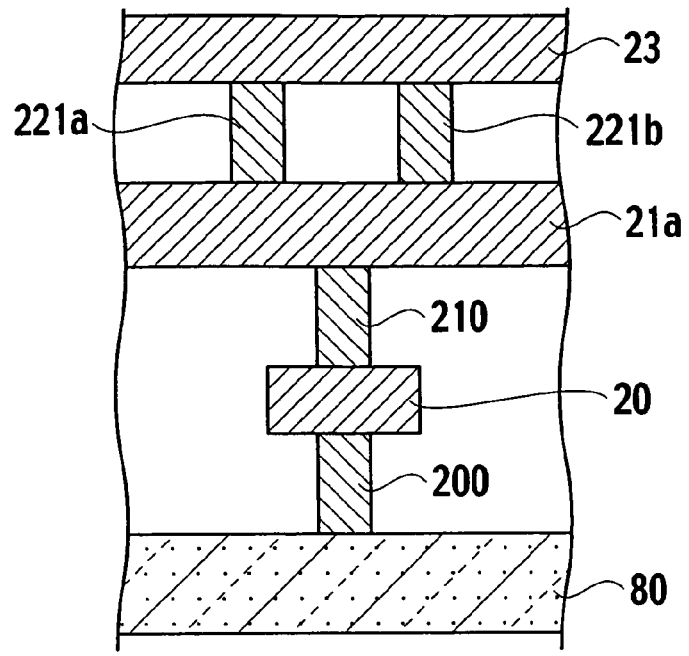
FIG. 21 shows a sectional view along a V-V direction of FIG. 20.

FIG. 21 is a sectional view along the V-V direction of FIG. 20. As shown in FIG. 21, the second cell well line 23 arranged in the second interconnect layer is connected to the first cell well line 21a arranged in the first interconnect layer through the vias 221a and 221b. The first cell well line 21a is connected to an M0 cell well line 20 arranged in a cell interconnect layer through the via 210. The M0 cell well line 20 is connected to a shunt region on a p-well region 80 through the via 200. In other words, the p-well region 80 and the second cell well line 22a are electrically connected.

Figure 22:
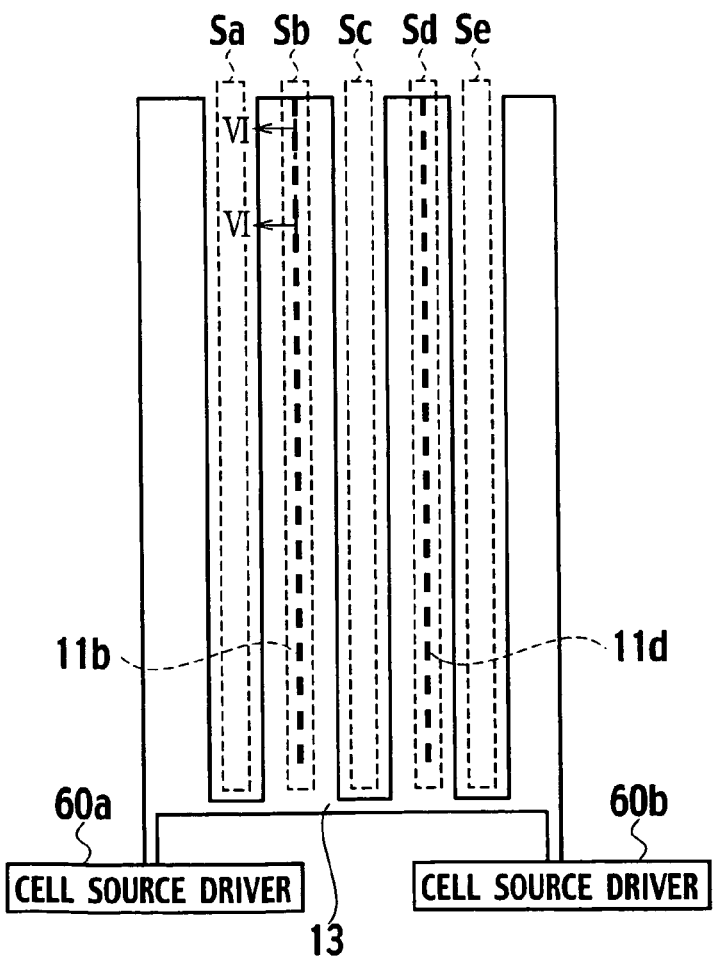
FIG. 22 shows a schematic structure of cell source lines of a NAND-type nonvolatile semiconductor memory according to the second embodiment of the present invention.

FIG. 22 shows an exemplary arrangement of the first cell source lines 11b and 11d and the second cell source line 13. The first cell source lines 11b and 11d are arranged on the respective shunt regions Sb and Sd. Vias connecting the first cell source lines 11b and 11d and the second cell source line 13 are arranged above the shunt regions Sb and Sd. In other words, the first cell source lines 11b and 11d are electrically connected to the second cell source line 13 on the shunt regions Sb and Sd. Note that the second cell source line 13 may be arranged in mesh configuration in the same manner as the second cell source line 12 shown in FIG. 5.

Figure 23:
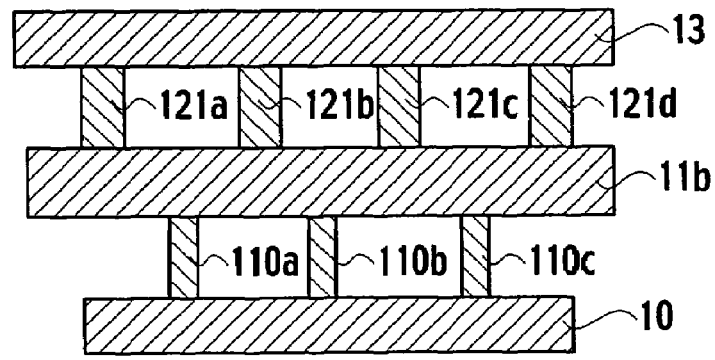
FIG. 23 shows a sectional view along a VI-VI direction of FIG. 22.

FIG. 23 is a sectional view along the VI-VI direction of FIG. 22. As shown in FIG. 23, the second cell source line 13 arranged in the second interconnect layer is connected to the first cell source line 11b arranged in the first interconnect layer through the vias 121a through 121d. The first cell source line 11b is connected to an M0 cell source line 10 arranged in a cell interconnect layer through the vias 110a through 110c. As mentioned above, the M0 cell source line 10 is connected to the source terminals of the select transistors in the memory cell array 30.

In general, an increase in the interconnect resistance of cell source lines has a greater effect on the performance of a NAND-type nonvolatile semiconductor memory than does the interconnect resistance of cell well lines. Accordingly, a reduction in the interconnect resistance of the second cell source line 13 has a higher priority than reduction of the interconnect resistance of the second cell well line 23. For example, as shown in FIG. 22, the second cell well line 23 may be arranged only on the upper side of the shunt regions Sa, Sc, and Se so that the area of the second cell source line 13 in the second interconnect layer may be as large as possible.

Figure 24:
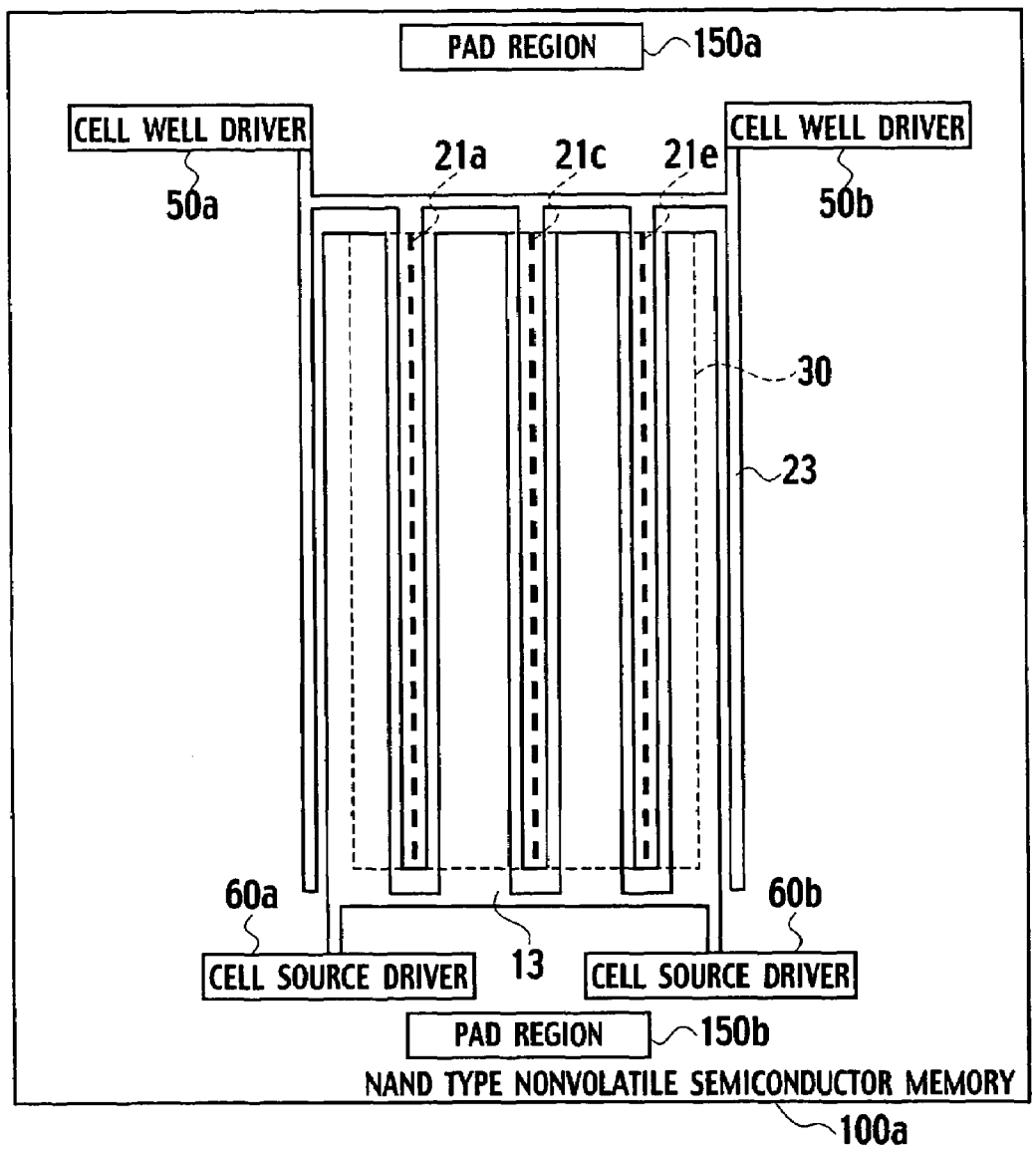
FIG. 24 shows another schematic structure of a NAND-type nonvolatile semiconductor memory according to the second embodiment of the present invention.

FIG. 19 shows a top plan view of an exemplary arrangement where cell well drivers 50a and 50b and cell source drivers 60a and 60b are arranged on the lower side of the memory cell array 30. For example, as shown in FIG. 16, when a pad region 150 is arranged only on the lower side of a NAND-type nonvolatile semiconductor memory 100a, arrangement of the cell well drivers 50a and 50b and the cell source drivers 60a and 60b on the lower side of the memory cell array 30 has an effect on the reduction of the interconnect resistance of the cell source lines and the cell well lines. As shown in FIG. 24, when pad regions 150a and 150b are arranged on the lower and upper sides of the NAND-type nonvolatile semiconductor memory 100a, respectively, the cell well drivers 50a and 50b may be arranged on the lower side of the memory cell array 30, and the cell source drivers 60a and 60b may be arranged on the lower side of the memory cell array 30.

Figure 25:
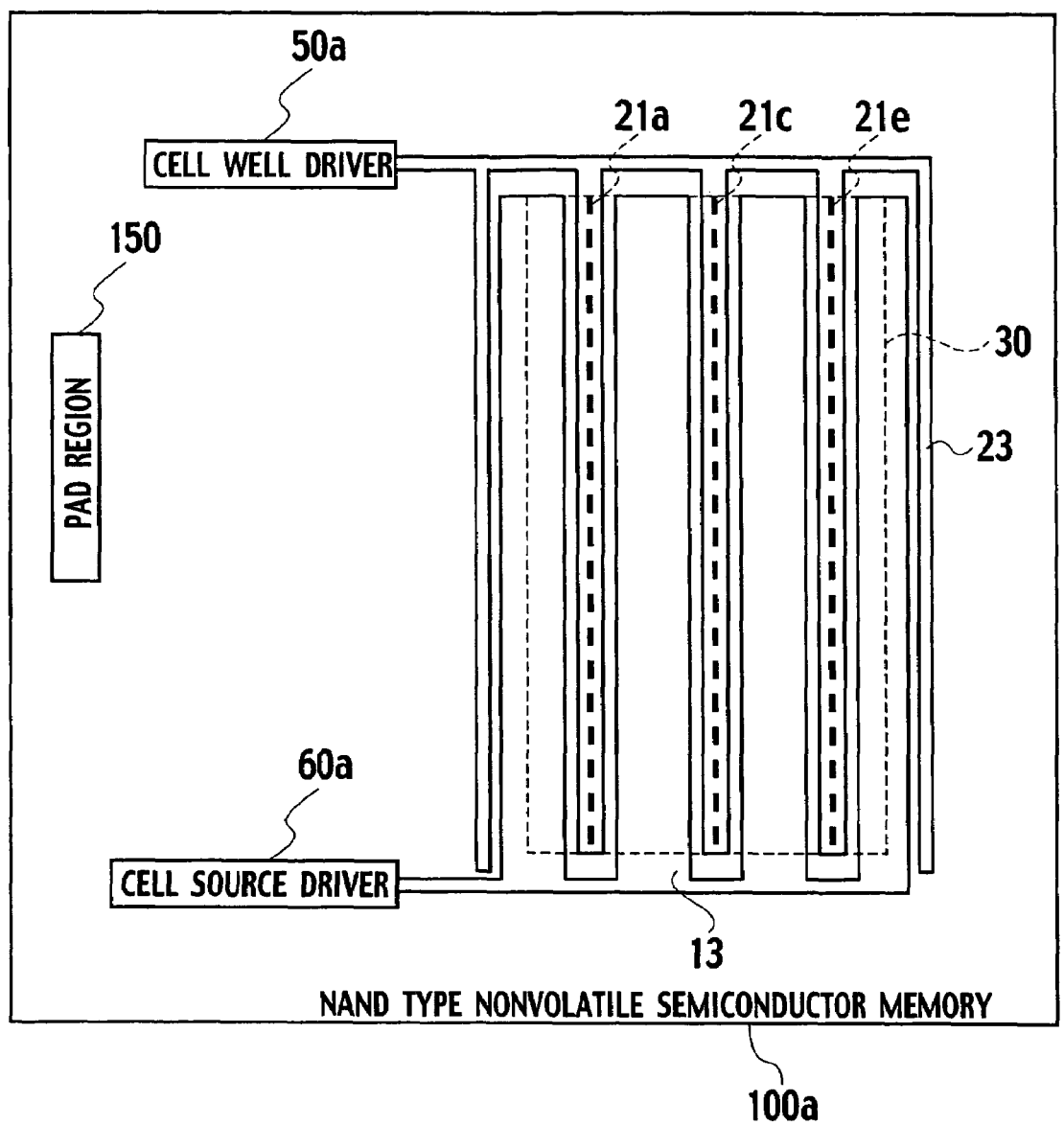
FIG. 25 shows another schematic structure of a NAND-type nonvolatile semiconductor memory according to the second embodiment of the present invention.

As shown in FIG. 25, when the pad region 150 is arranged only on the left side of the NAND-type nonvolatile semiconductor memory 100a, the interconnect resistance of the cell source lines and the cell well lines is reduced by arranging the cell well driver 50a and the cell source driver 60a on the left side of the memory cell array 30.

Figure 26:
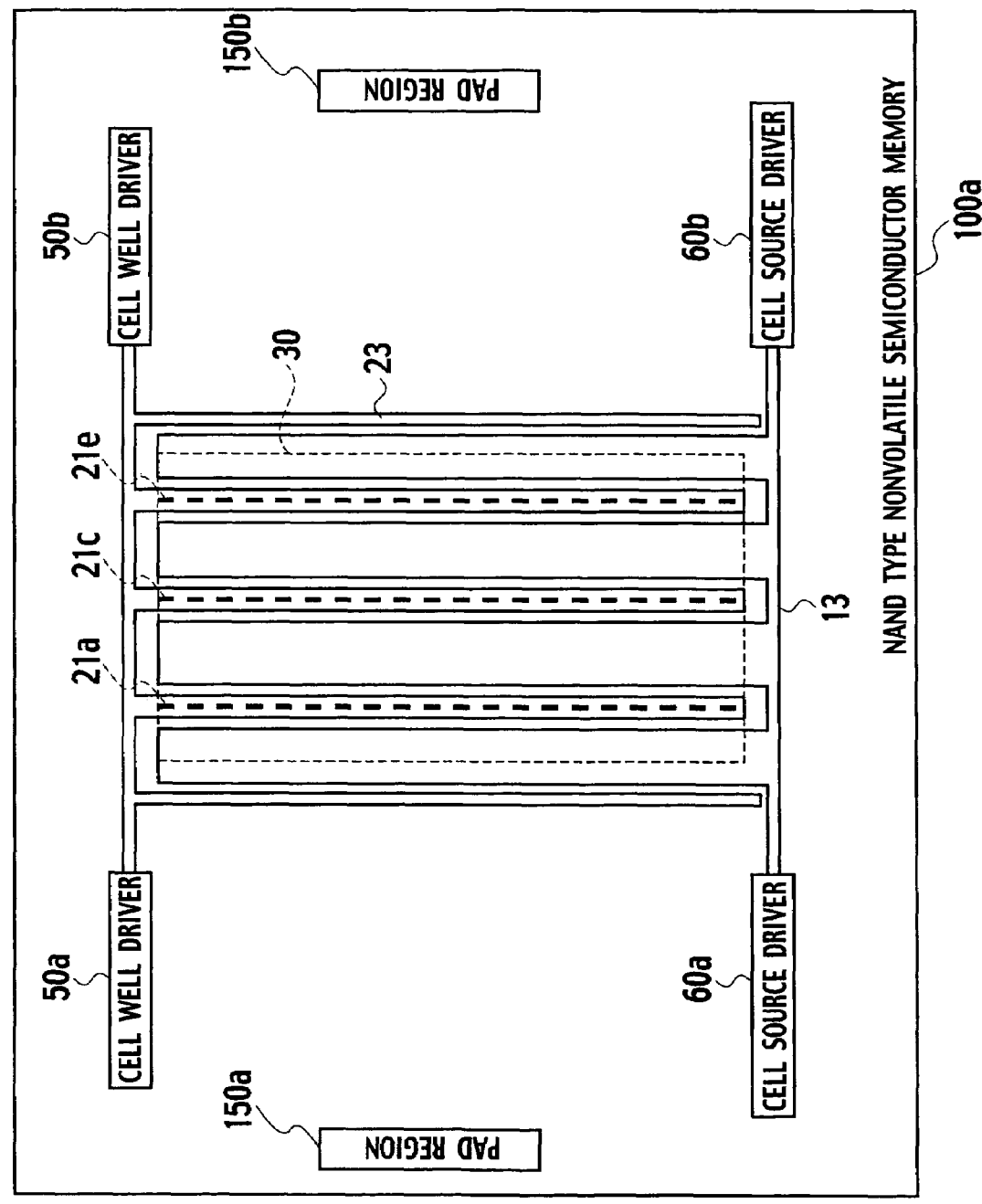
FIG. 26 shows another schematic structure of a NAND-type nonvolatile semiconductor memory according to the second embodiment of the present invention.

As shown in FIG. 26, when the pad regions 150a and 150b are arranged on the left and right sides of the NAND-type nonvolatile semiconductor memory 100a, respectively, the cell well driver 50a and the cell source driver 60a may be arranged on the left side of the memory cell array 30 and the cell well driver 50b and the cell source driver 60b may be arranged on the right side of the memory cell array 30. Arrangement of the cell well drivers and the cell source drivers on both sides of the memory cell array 30 reduces the length of the cell source lines and the cell well lines, resulting in a reduction of the interconnect resistance of the cell source lines and the cell well lines.

According to the NAND-type nonvolatile semiconductor memory 100 shown in FIG. 1, the second cell source line 12 is arranged around the memory cell array 30. The NAND-type nonvolatile semiconductor memory 100 requires the second cell well line 22h to be extended to the outer region of the memory cell array 30 through the first cell well line 21h, as shown in FIGS. 10A and 10B. The interconnect resistance of the cell well lines increases due to the vias 221h1 and 221h2 connected thereto.

However, according to the NAND-type nonvolatile semiconductor memory of the second embodiment shown in FIG. 19, the second cell well line 23 is extended to the outer region of the memory cell array 30 without passing through the first interconnect layer. The NAND-type nonvolatile semiconductor memory shown in FIG. 19 decreases the interconnect resistance of the cell well lines. Other features are substantially the same as the first embodiment, and repetitive description thereof is thus omitted.

THIRD EMBODIMENT

Figure 27:
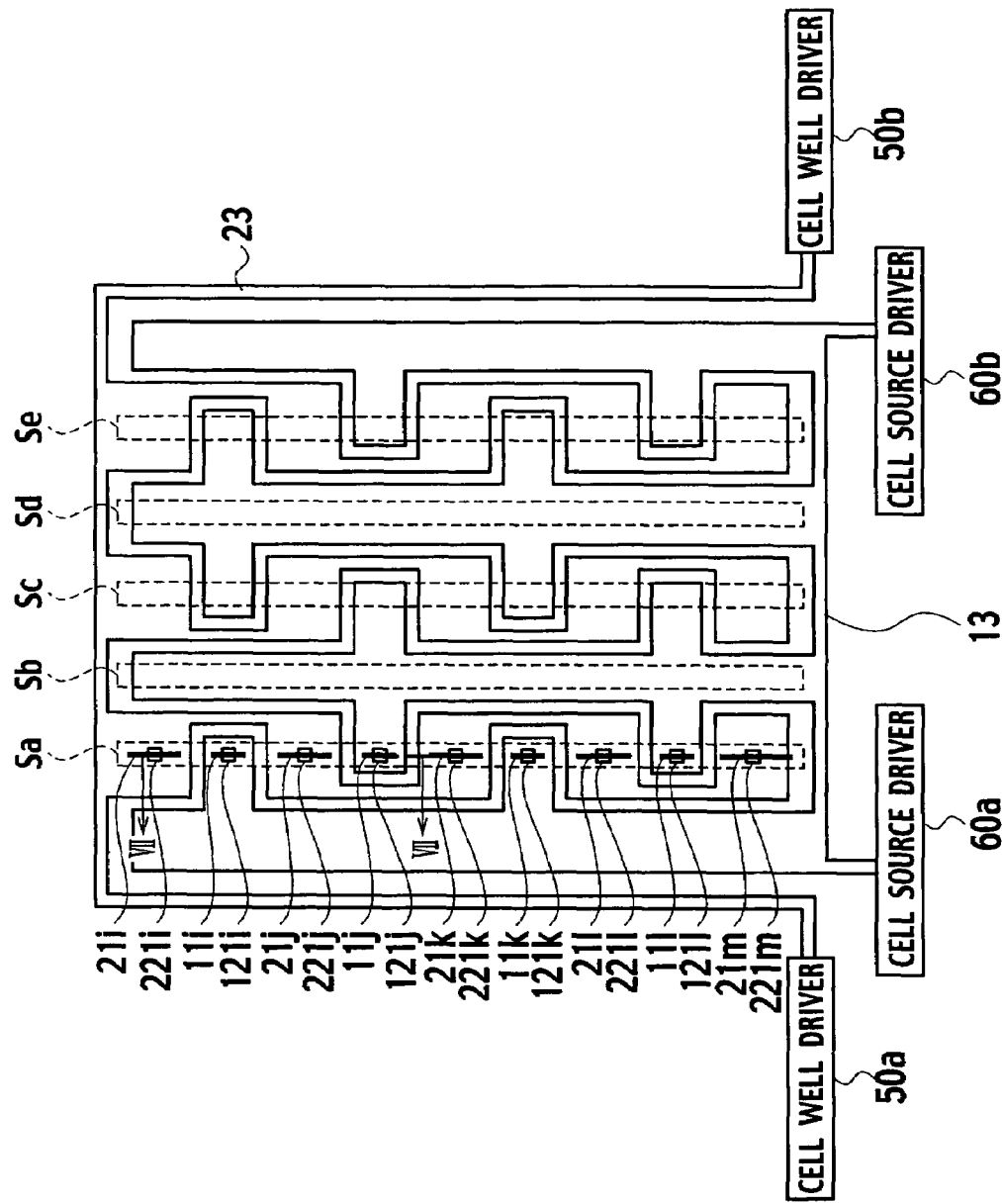
FIG. 27 shows a schematic structure of a NAND-type nonvolatile semiconductor memory according to a third embodiment of the present invention.

As shown in FIG. 27, a NAND-type nonvolatile semiconductor memory according to the third embodiment of the present invention includes vias 121i through 121l on a shunt region Sa on which vias 221i through 221m connect a second cell well line 23 arranged in the second interconnect layer and first cell well lines 21i through 21m arranged in the first interconnect layer. The vias 121i through 121l connect a second cell source line 13 arranged in a second interconnect layer and first cell source lines 11i through 11l arranged in a first interconnect layer.

As shown in FIG. 27, the vias 221i through 221m and 121i through 121l are linearly arranged along the memory cell column length. FIG. 27 shows only the vias 221i through 221m and 121i through 121l arranged above the shunt region Sa; however, vias which connect the second cell source line 13 and cell source lines arranged in the first interconnect layer are arranged above the shunt regions Sc and Se, as well as the shunt region Sa.

Figure 28:
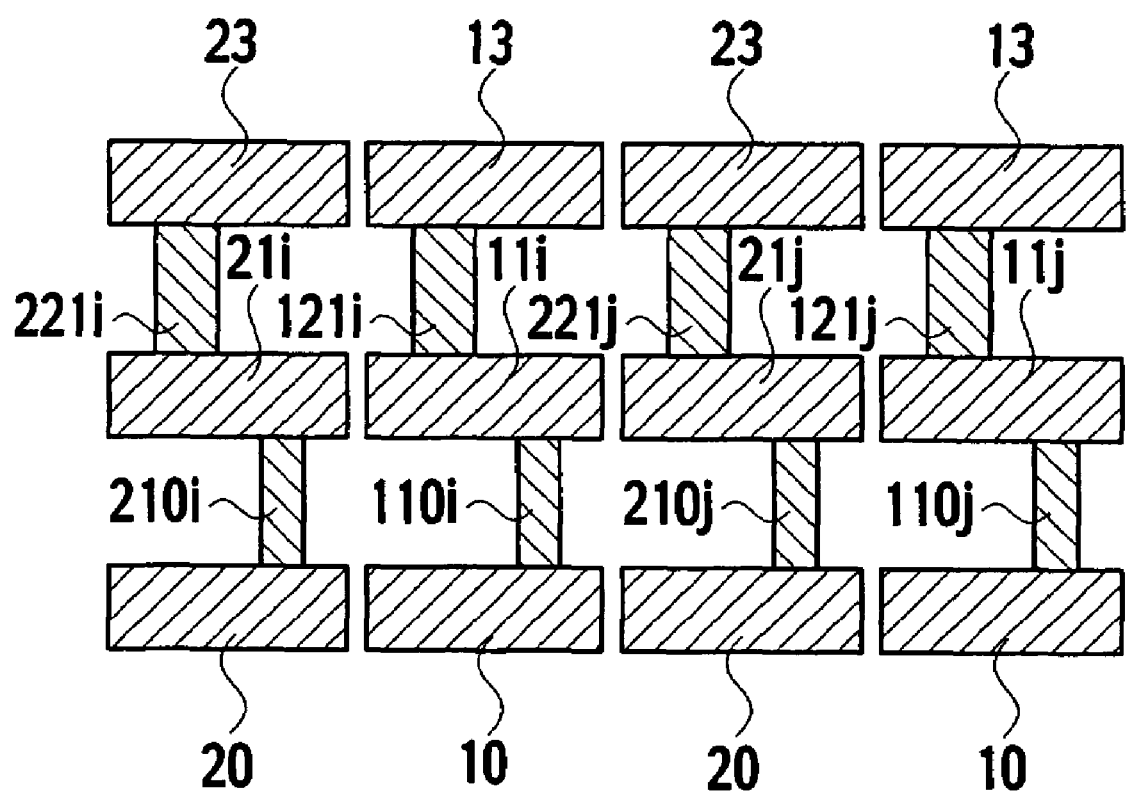
FIG. 28 shows a sectional view along a VII-VII direction of FIG. 27.

FIG. 28 is a sectional view along the VII-VII direction of FIG. 27. As shown in FIG. 28, the second cell well line 23 arranged in the second interconnect layer is connected to the first cell well lines 21i and 21j arranged in the first interconnect layer through the vias 221i and 221j. The first cell well lines 21i and 21j are connected to an M0 cell well line 20 arranged in a cell interconnect layer through vias 210i and 210j. As mentioned above, the M0 cell well line 20 is connected to the shunt region on a p-well region 80. The second cell source line 13 arranged in the second interconnect layer is connected to the first cell source lines 11i and 11j arranged in the first interconnect layer through the vias 121i and 121j. The first cell source lines 11i and 11j are connected to an M0 cell source line 10 arranged in the cell interconnect layer through the vias 110i and 110j. As mentioned above, the M0 cell source line 10 is connected to the source terminals of the select transistors in the memory cell array 30.

According to the NAND-type nonvolatile semiconductor memory shown in FIG. 27, vias which connect the second cell source line 13, arranged in the second interconnect layer, and the cell source lines, arranged in the first interconnect layer, are arranged above the shunt regions Sa, Sc, and Se. Accordingly, the number of vias, which connect the second cell source line 13 and the source lines arranged in the first interconnect layer, increases so as to be larger than the number of vias in the NAND-type nonvolatile semiconductor memory shown in FIG. 19. Thus, the NAND-type nonvolatile semiconductor memory shown in FIG. 27 reduces the interconnect resistance of the cell source lines from the cell source drivers 60a and 60b to the select transistors. Other features are substantially the same as the second embodiment, and repetitive description thereof is thus omitted.

OTHER EMBODIMENTS

According to the first through the third embodiment, an example of reducing the area of shunt regions in a memory cell array 30 by reducing the number of shunt regions has been described. Alternatively, the width of the shunt regions Sa through Se may be decreased by decreasing the interconnect width of the first cell well lines 21a through 21e and the first cell source lines 11a through 11e arranged in the first interconnect layer, for example. As a result, the area of the shunt regions in the memory cell array 20 may be reduced without reducing the number thereof.

In addition, an example where the second cell well lines 22a through 22h are arranged in the second interconnect layer above the first cell well lines 21a through 21e arranged in the first interconnect layer has been described. Alternatively, the second cell well lines 22a through 22h and the first cell well lines 21a through 21e may be arranged in the same interconnect layer. For example, the second cell well lines 22a through 22h and the first cell well lines 21a through 21e are arranged in the interconnect layer in which the second cell source line 12 is arranged, and only parts of the first cell well lines 21a through 21e, which cross the second cell source line 12, may be arranged in the first interconnect layer.

Various modifications will become possible for those skilled in the art after receiving the teachings of the present disclosure without departing from the scope thereof.

What is claimed is:

1. A nonvolatile semiconductor memory comprising:
   a memory cell array including horizontally aligned memory cell columns, each of the memory cell columns including vertically arranged memory cell transistors and select transistors selecting the memory cell transistors;

a plurality of first cell well lines connected to well regions in which the memory cell columns are formed;

a plurality of second cell well lines being arranged in an interconnect layer above the first cell well lines and connected to the first cell well lines through vias in contact with the first cell well lines and the second cell well lines, so that the first cell well lines electrically connect to one another; and a cell source line connected to source terminals of the select transistors in each memory cell column.

2. The memory of claim 1, wherein the cell source line comprises:

a plurality of first cell source lines connected to the source terminals of the select transistors; and a second cell source line being arranged in an interconnect layer in which the second cell well lines are arranged and connected to the first cell source lines.

3. The memory of claim 2, wherein the first cell source lines are arranged in an interconnect layer in which bit lines controlling operation of the memory cell array are arranged.

4. The memory of claim 3, wherein the first cell source lines are arranged in parallel with the bit lines.

5. The memory of claim 2, wherein the second cell source line is arranged in a mesh configuration and surrounds the second cell well lines.

6. The memory of claim 1, wherein the first cell well lines are arranged in an interconnect layer in which bit lines controlling operation of the memory cell array are arranged.

7. The memory of claim 6, wherein the first cell well lines are arranged in parallel with the bit lines.

8. The memory of claim 1, wherein the second cell well lines extend in a direction perpendicular to the first cell well lines.

9. The memory of claim 1, wherein sheet resistance of the second cell well lines is lower than sheet resistance of the first cell well lines.

10. A nonvolatile semiconductor memory comprising:

a memory cell array including horizontally arranged memory cell columns, each of the memory cell columns including vertically aligned memory cell transistors and select transistors selecting the memory cell transistors;

a plurality of first cell well lines connected to well regions in which the memory cell columns are formed;

a plurality of first cell source lines connected to source terminals of the select transistors in each memory cell column;

a second cell well line being arranged in an interconnect layer above the first cell well lines and being connected to the first cell well lines through vias in contact with the first cell well lines and the second cell well line; and a second cell source line being arranged in an interconnect layer in which the second cell well line is arranged so as to form an interdigital structure with the second cell well line, and connected to the first cell source lines.

11. The memory of claim 10, wherein a part of the second cell source line is arranged in a mesh configuration.

12. The memory of claim 10, wherein the second cell well line is arranged above a shunt region in which the memory cell columns are not arranged.

13. The memory of claim 10, wherein vias connecting the first cell well lines and the well regions are arranged above a shunt region in which the memory cell columns are not arranged.

14. The memory of claim 10, wherein the first cell well lines are arranged in an interconnect layer in which bit lines controlling operation of the memory cell array are arranged.

15. The memory of claim 14, wherein the first cell well lines are arranged in parallel with the bit lines.

16. The memory of claim 14, wherein vias connecting the first cell well lines and the second cell well line and vias connecting the first cell source lines and the second cell source line are linearly arranged in parallel with the bit lines.

17. The memory of claim 10, wherein the first cell source lines are arranged in an interconnect layer in which bit lines controlling operation of the memory cell array are arranged.

18. The memory of claim 17, wherein the first cell source lines are arranged in parallel with the bit lines.

19. The memory of claim 10, further comprising:

a cell well driver configured to set a potential of the first cell well lines and the second cell well line; and a cell source driver configured to set a potential of the first cell source lines and the second cell source line.

20. The memory of claim 10, wherein sheet resistance of the second cell well line is lower than sheet resistance of the first cell well lines.

* * * * *